United States Patent
Ju et al.

(10) Patent No.: US 8,884,262 B2
(45) Date of Patent: Nov. 11, 2014

(54) NON-VOLATILE MEMORY DEVICE HAVING A RESISTANCE-CHANGEABLE ELEMENT AND METHOD OF FORMING THE SAME

(75) Inventors: Hyun-Su Ju, Hwaseong-si (KR); Sun-Jung Kim, Yongin-si (KR); Soo-Doo Chae, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 235 days.

(21) Appl. No.: 13/487,570

(22) Filed: Jun. 4, 2012

(65) Prior Publication Data
US 2012/0305877 A1 Dec. 6, 2012

(30) Foreign Application Priority Data
Jun. 3, 2011 (KR) .................. 10-2011-0054072

(51) Int. Cl.
*H01L 29/06* (2006.01)
*H01L 27/24* (2006.01)
*H01L 45/00* (2006.01)

(52) U.S. Cl.
CPC ........... *H01L 27/249* (2013.01); *H01L 45/1226* (2013.01); *H01L 45/04* (2013.01); *H01L 45/146* (2013.01)
USPC ...... 257/4; 257/5; 257/E45.002; 257/E45.003

(58) Field of Classification Search
CPC ....... H01L 45/04; H01L 45/06; H01L 45/146; H01L 27/24; H01L 27/2481
USPC .......................... 257/4, 5, E45.002, E45.003
See application file for complete search history.

(56) References Cited

U.S. PATENT DOCUMENTS

| 7,700,935 | B2 | 4/2010 | Kim et al. |
| 7,800,091 | B2 | 9/2010 | Kamigaichi et al. |
| 7,855,457 | B2 * | 12/2010 | Mizukami et al. ............ 257/758 |
| 8,525,247 | B2 * | 9/2013 | Park et al. ..................... 257/314 |
| 8,559,224 | B2 * | 10/2013 | Han et al. ................. 365/185.11 |
| 8,592,789 | B2 * | 11/2013 | Sasago et al. ..................... 257/2 |

FOREIGN PATENT DOCUMENTS

| JP | 2008-135744 | 6/2008 |
| JP | 2008-277543 | 11/2008 |
| JP | 2010-251479 | 11/2010 |
| KR | 1020080048314 | 6/2008 |
| KR | 1020080096432 | 10/2008 |

* cited by examiner

Primary Examiner — Minh-Loan T Tran
(74) Attorney, Agent, or Firm — F. Chau & Associates, LLC

(57) ABSTRACT

A non-volatile memory device is provided wherein a lower molding layer is formed on a substrate; a first horizontal interconnection is formed on the lower molding layer; an upper molding layer is formed on the first horizontal interconnection; a pillar is formed connected to the substrate by vertically passing through the upper molding layer, the first horizontal interconnection and the lower molding layer. The pillar has a lower part and an upper part, wherein the lower part is disposed on the same level as the first horizontal interconnection and has a first width and the upper part is disposed on a higher level than the first horizontal interconnection and has a second width different from the first width.

18 Claims, 23 Drawing Sheets

NON-VOLATILE MEMORY DEVICE HAVING A RESISTANCE-CHANGEABLE ELEMENT AND METHOD OF FORMING THE SAME

CROSS-REFERENCE TO RELATED APPLICATION

This application claims priority under 35 U.S.C. §119 to Korean Patent Application No. 10-2011-0054072 filed on Jun. 3, 2011, the disclosure of which is hereby incorporated by reference in its entirety.

TECHNICAL FIELD

Example embodiments of the inventive concept relate to a non-volatile memory device having a plurality of memory cells which are vertically stacked, and a method of forming the same.

DESCRIPTION OF THE RELATED ART

A transition-metal-oxide (TMO) layer is a major component of a Resistive Random Access Memory chip (RRAM), and is sensitive to heat during manufacturing. In a conventional vertical structure manufacturing processes, after the formation of the TMO layer, the layer is exposed to a high temperature which may be as high as 500° C. or more. This high temperature treatment and subsequent etching causes degradation of the desirable electrical performance characteristics of the TMO layer. In order to obtain a non-volatile memory device smaller in size with improved performance, various methods of vertically forming a plurality of memory cells on a substrate have been researched. It is desirable to develop a technique capable of avoiding damage to the TMO layer due to heat and etching.

SUMMARY

Example embodiments of the inventive concept provide a non-volatile memory device capable of preventing degradation in characteristics of a resistance-changeable element.

Example embodiments of the inventive concept also provide a method of forming a non-volatile memory device capable of preventing degradation in characteristics of a resistance-changeable element.

The inventive concept is not limited to the above-mentioned example embodiments, and other example embodiments which are not described will be clearly understood by those of ordinary skill in the art from the following description.

In accordance with an aspect of the inventive concept, a non-volatile memory device is provided. The device includes a lower molding layer formed on a substrate. A first horizontal interconnection is formed on the lower molding layer. An upper molding layer is formed on the first horizontal interconnection. A pillar connected to the substrate is provided by vertically passing through the upper molding layer, the first horizontal interconnection and the lower molding layer. The pillar includes a lower part disposed on the same level as the first horizontal interconnection and having a first width, and an upper part disposed on a higher level than the first horizontal interconnection and having a second width different from the first width.

In an applied example embodiment, a first interlayer insulating layer may be formed on the upper molding layer. The upper part may be on the same level as the first interlayer insulating layer. A second interlayer insulating layer covering sidewalls of the lower molding layer, the upper molding layer and the first horizontal interconnection may be formed. The second interlayer insulating layer may extend on the first interlayer insulating layer.

In an example embodiment, central axes of the upper part and the lower part may be misaligned. The second width may be larger than the first width.

In an example embodiment, a resistance-changeable element may be formed between the pillar and the first horizontal interconnection. The resistance-changeable element may surround sidewalls of the upper part and the lower part.

In an example embodiment, the pillar may include an electrode layer and a reactive metal layer. The reactive metal layer may surround a sidewall of the electrode layer and may be in contact with the resistance-changeable element.

In an example embodiment, the pillar may include a core surrounded by the electrode layer.

In an example embodiment, a diode layer may be formed between the first horizontal interconnections and the pillar. The diode layer may surround the sidewalls of the upper part and the lower part.

In an example embodiment, a conductive pad may be formed on the upper part. A second horizontal interconnection may be formed on the conductive pad.

In accordance with an embodiment of the inventive concept, an non-volatile memory device is provided, wherein the device includes a plurality of molding layers and a plurality of first horizontal interconnections, which are alternatively stacked. An interlayer insulating layer is formed on the molding layers. A pillar configured to pass through the interlayer insulating layer, the molding layers and the first horizontal interconnections, and having an upper part and a lower part is formed. A second horizontal interconnection connected to the upper part is formed. A resistance-changeable element is formed between the lower part and the first horizontal interconnections. The upper part and the lower part are asymmetrically aligned. The upper part is in continuity with the lower part. The upper and lower parts are formed of the same material.

Details of other example embodiments are incorporated in the detailed description and drawings.

BRIEF DESCRIPTION OF THE DRAWINGS

The foregoing and other features of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
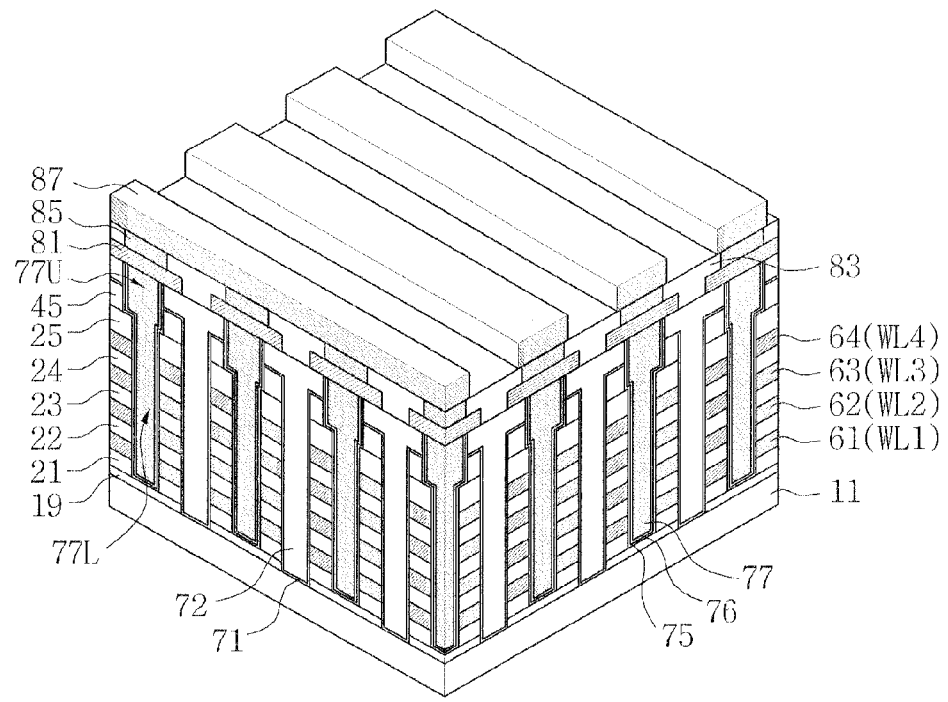
FIGS. 1 and 2 are a perspective view and a cross-sectional view of a non-volatile memory device according to an example embodiment of the inventive concept, respectively.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein. In the drawings, like numbers refer to like elements throughout the description of the figures, and the thicknesses of layers and regions may be exaggerated for clarity. In addition, when it is described that a first element is disposed "on" or "above" a second element, it means that the first element may be disposed on and in directly contact with the second element, or a third element may be disposed between the first and second elements.

Here, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that "above" and "below", "top surface" and "bottom surface", or "upper part" and "lower part" are used to distinguish relative positions of elements. For example, for convenience, when an upper portion of the drawing is termed an upper part and a lower portion of the drawing is termed a lower part, in practice, the upper part could be termed a lower part and the lower part could be termed an upper part, without departing from the scope of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In addition, unless otherwise defined, all terms used herein including technical or scientific terms have the same meanings as those which are generally understood by one of ordinary skill in the art. It should be clear that terms defined by dictionaries generally used to have meanings corresponding to those from the context in related technology, and if not clearly defined herein, are not to be understood with ideal or excessively formal meanings.

Figure 2:
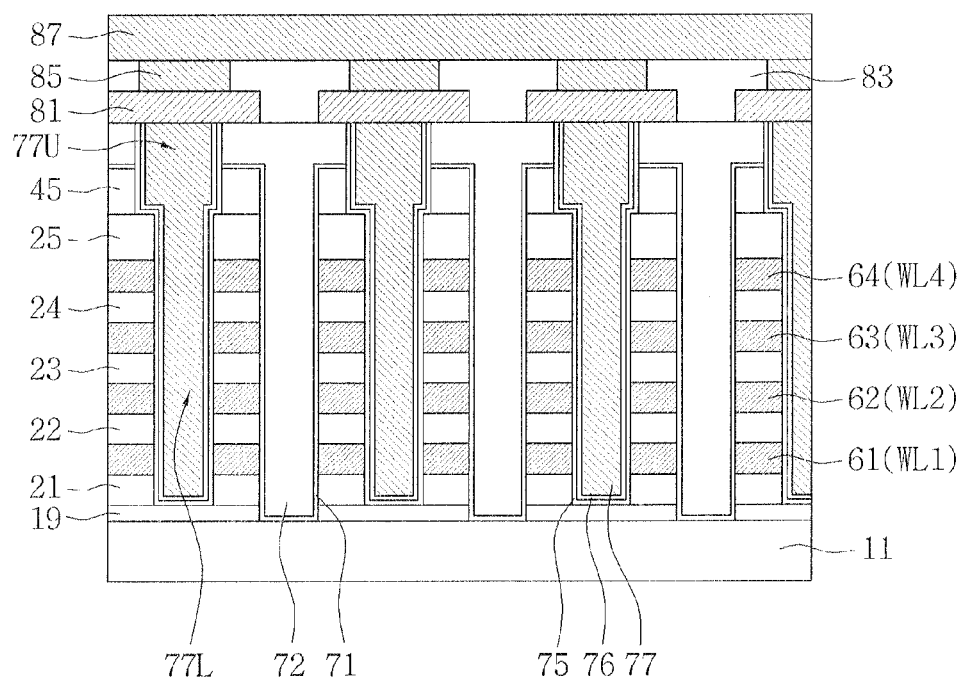

FIG. 1 is a perspective view of a non-volatile memory device according to an example embodiment of the inventive concept, and FIG. 2 is a cross-sectional view of a vertical section of FIG. 1.

Referring to FIGS. 1 and 2, a buffer layer 19 covering a semiconductor substrate 11 may be formed. A plurality of molding layers 21, 22, 23, 24 and 25 and a plurality of word lines 61, 62, 63 and 64 may be alternately and repeatedly formed on the buffer layer 19.

A first molding layer 21 may be formed on the buffer layer 19. A first word line 61 may be formed on the first molding layer 21. A second molding layer 22 may be formed on the first word line 61. A second word line 62 may be formed on the second molding layer 22. A third molding layer 23 may be formed on the second word line 62. A third word line 63 may be formed on the third molding layer 23. A fourth molding layer 24 may be formed on the third word line 63. A fourth word line 64 may be formed on the fourth molding layer 24. A fifth molding layer 25 may be formed on the fourth word line 64.

A first interlayer insulating layer 45 may be formed on the fifth molding layer 25. Second interlayer insulating layers 71 and 72 may be formed on the first interlayer insulating layer 45. The second interlayer insulating layers 71 and 72 may cover sidewalls of the molding layers 21 to 25, the word lines 61 to 64 and the first interlayer insulating layer 45, and extend on the first interlayer insulating layer 45. The second interlayer insulating layers 71 and 72 may include a nitride layer 71 and an oxide layer 72, which are sequentially stacked.

A resistance-changeable element 75 and a bit pillar 76 and 77 may be formed through the second interlayer insulating layers 71 and 72, the first interlayer insulating layer 45, the molding layers 21 to 25 and the word lines 61 to 64.

The bit pillar 76 and 77 may include a reactive metal layer 76 and an electrode layer 77. The reactive metal layer 76 may be formed to surround the sidewall and bottom of the electrode layer 77. The resistance-changeable element 75 may be formed to surround the sidewall and bottom of the bit pillar 76 and 77. The reactive metal layer 76 may be formed between the resistance-changeable element 75 and the electrode layer 77. The reactive metal layer 76 may contact the resistance-changeable element 75 and the electrode layer 77. The bit pillar 76 and 77 may be divided into an upper part 77U and a lower part 77L.

A bit pad 81 covering the upper part 77U may be formed on the second interlayer insulating layers 71 and 72. An upper insulating layer 83 covering the second interlayer insulating layers 71 and 72 and the bit pad 81 may be formed. A big plug 85 in contact with the bit pad 81 through the upper insulating layer 83 may be formed. A bit line 87 in contact with the bit plug 85 may be formed on the upper insulating layer 83.

The upper part 77U may be formed on the same level as the first interlayer insulating layer 45 and the second interlayer insulating layers 71 and 72. The upper part 77U may pass through the first interlayer insulating layer 45 and the second interlayer insulating layers 71 and 72. The lower part 77L may pass through the molding layers 21 to 25 and the word lines 61 to 64. The upper part 77U may be in continuity with the lower part 77L. Furthermore, the upper part 77U and the lower part 77L may have an integrated structure. The upper part 77U and the lower part 77L may be simultaneously formed and include the same material. The resistance-changeable element 75 may be formed to surround sidewalls and bottom of the upper and lower parts 77U and 77L.

The upper and lower parts 77U and 77L may have different horizontal widths. The upper part 77U may have a larger horizontal width than the lower part 77L. The upper and lower parts 77U and 77L may be asymmetrically aligned. The upper part 77U may be misaligned with respect to the lower part 77L. A center of the upper part 77U may not be matched with a center of the lower part 77L. That is, a central axis of the upper part 77U and a central axis of the lower part 77L may be misaligned with each other. A vertical sidewall of the upper part 77U may not be matched with a vertical sidewall of the lower part 77L.

In an example embodiment, the word lines 61 to 64 may be referred to as first horizontal interconnections, the bit line 87 may be referred to as a second horizontal interconnection, and the bit pad 81 may be referred to as a conductive pad. In this case, the fourth word line 64 may correspond to an upper interconnection, and the fifth molding layer 25 may correspond to an upper molding layer.

Figure 3:
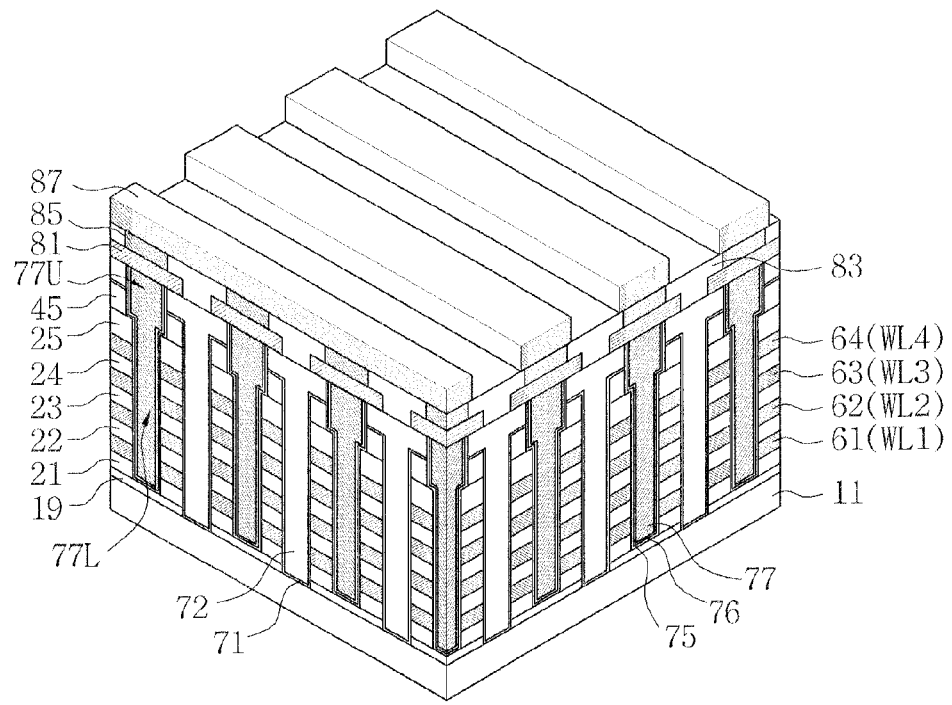
FIGS. 3 and 4 are a perspective view and a cross-sectional view of a non-volatile memory device according to an example embodiment of the inventive concept, respectively.
Figure 4:
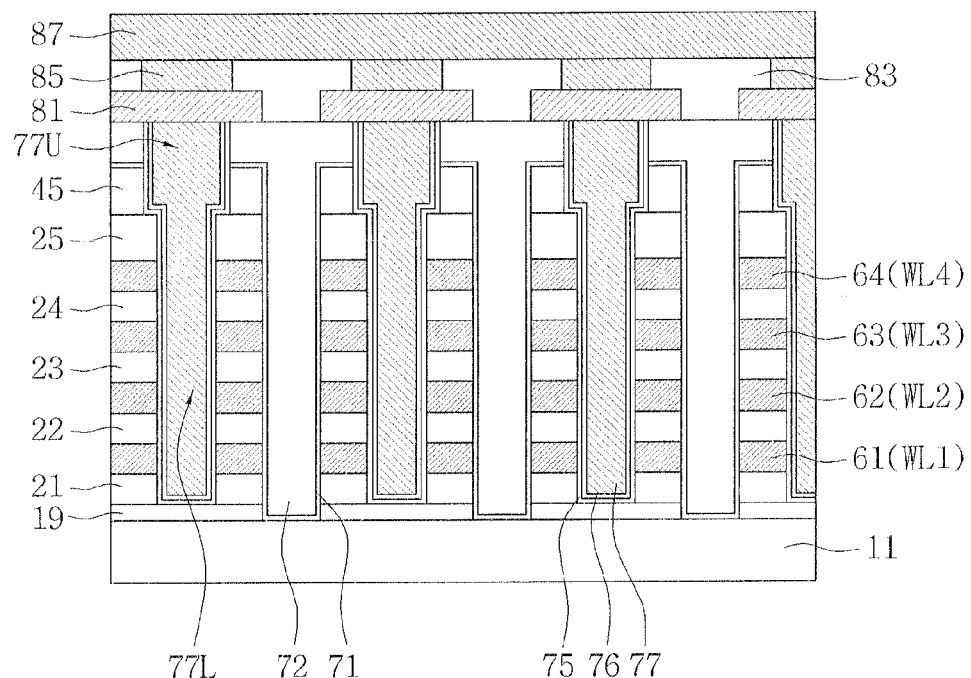

FIG. 3 is a perspective view of a non-volatile memory device according to an example embodiment of the inventive concept, and FIG. 4 is a cross-sectional view of a vertical section of FIG. 3. Referring to FIGS. 3 and 4, a center of an upper part 77U may be formed to correspond to a center of a lower part 77L.

Figure 5:
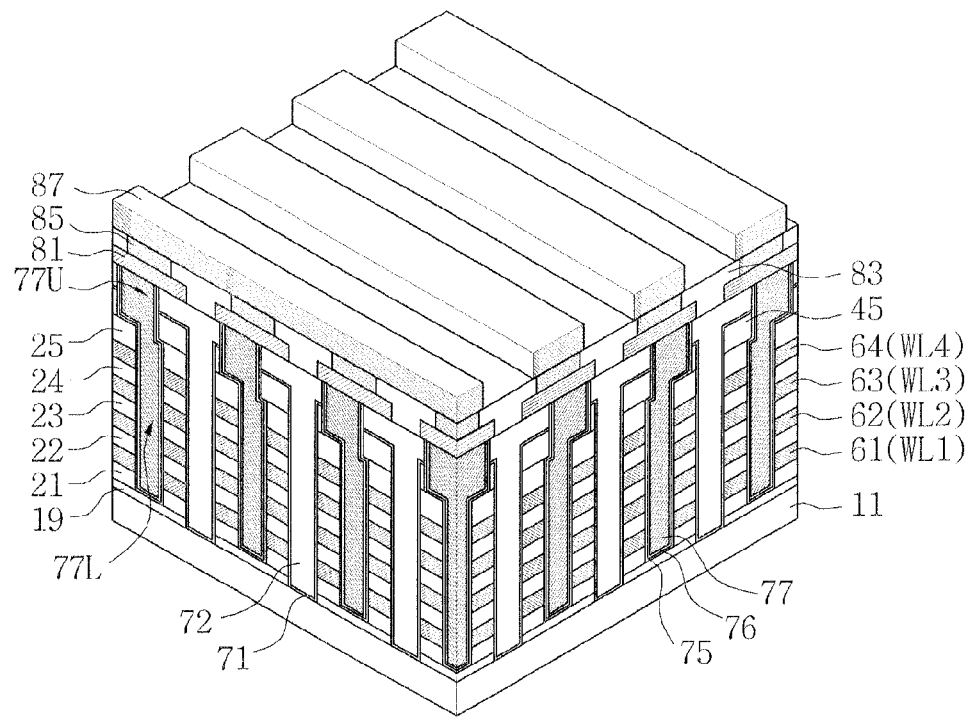
FIGS. 5 and 6 are a perspective view and a cross-sectional view of a non-volatile memory device according to an example embodiment of the inventive concept, respectively.
Figure 6:
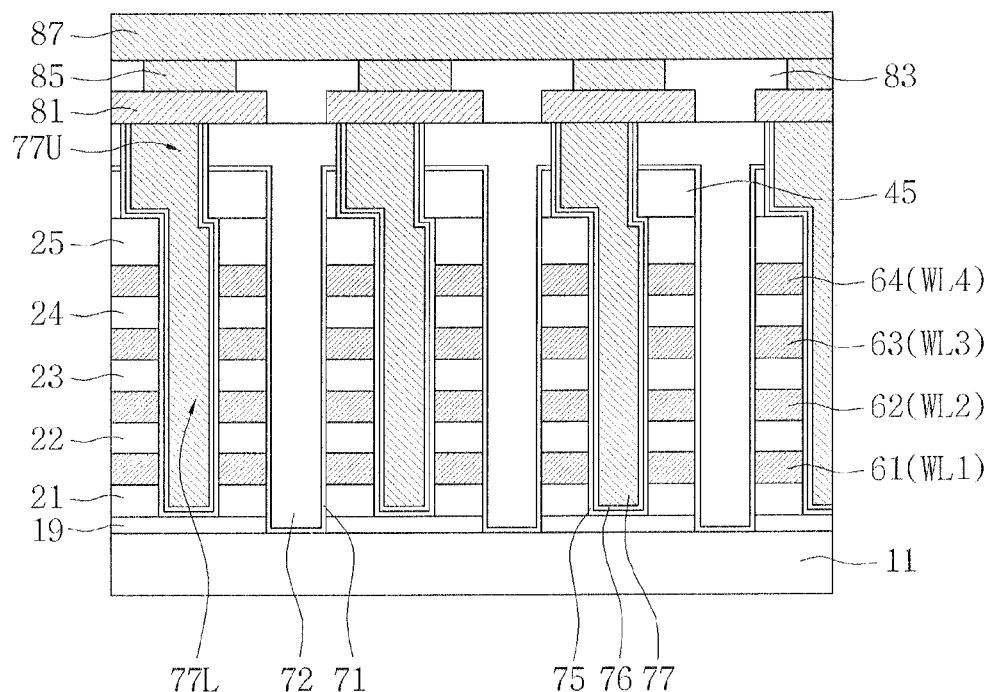

FIG. 5 is a perspective view of a non-volatile memory device according to an example embodiment of the inventive concept, and FIG. 6 is a cross-sectional view of a vertical section of FIG. 5. Referring to FIGS. 5 and 6, a center of an upper part 77U may not be matched with a center of a lower part 77L. A vertical sidewall of the upper part 77U may not be matched with a vertical sidewall of the lower part 77L. In this case, a first interlayer insulating layer 45 may partially cover a portion of a top surface of the lower part 77L.

Figure 7:
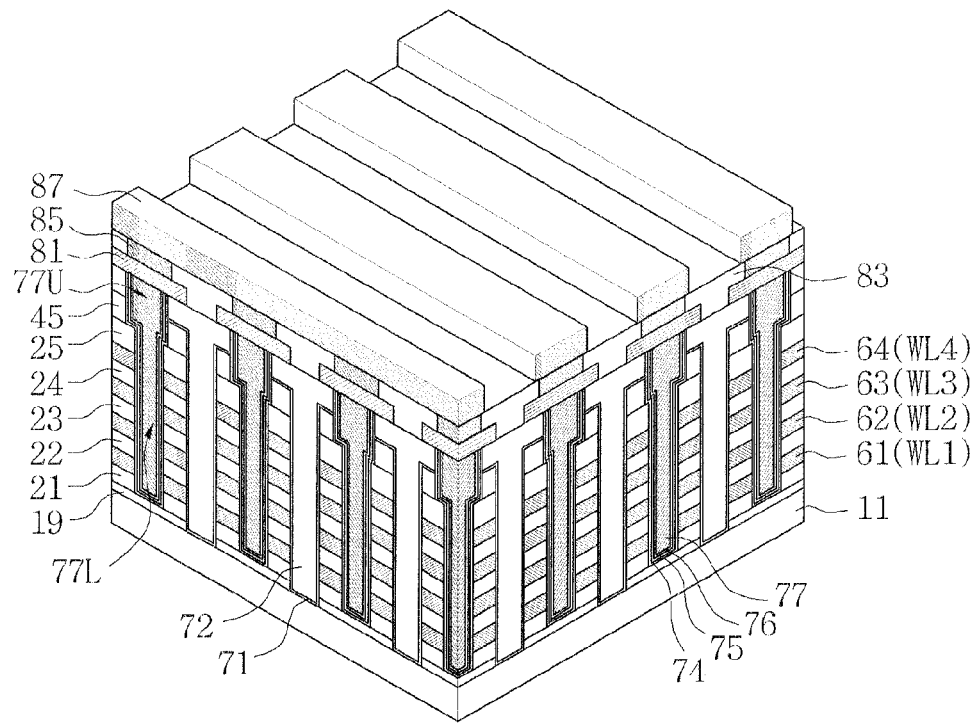
FIGS. 7 and 8 are a perspective view and a cross-sectional view of a non-volatile memory device according to an example embodiment of the inventive concept, respectively.
Figure 8:
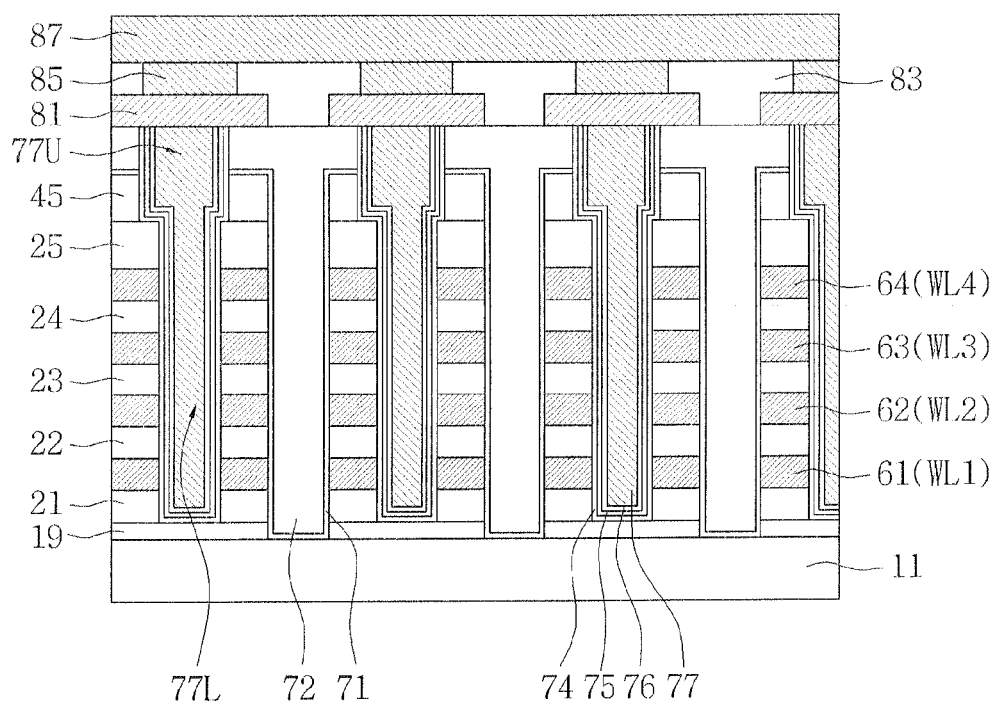

FIG. 7 is a perspective view of a non-volatile memory device according to an example embodiment of the inventive concept, and FIG. 8 is a cross-sectional view of a vertical section of FIG. 7.

Referring to FIGS. 7 and 8, a diode layer 74 may be formed between a bit pillar 76 and 77 and word lines 61, 62, 63 and 64. For example, the diode layer 74 may be interposed between a resistance-changeable element 75 and the word lines 61 to 64. The diode layer 74 may surround sidewalls of an upper part 77U and a lower part 77L. In this case, the resistance-changeable element 75 may be interposed between the diode layer 74 and the bit pillar 76 and 77. The diode layer 74 may include TiO, NiO, HfO, AlO, ZrO, ZnO, TaO, NbO or a combination of any two or more thereof.

In an example embodiment, the diode layer 74 may be interposed between the resistance-changeable element 75 and the bit pillar 76 and 77. In this case, the diode layer 74 may include a metal silicide, TiO, NiO, HfO, AlO, ZrO, ZnO, TaO, NbO or a combination of any two or more thereof.

Figure 9:
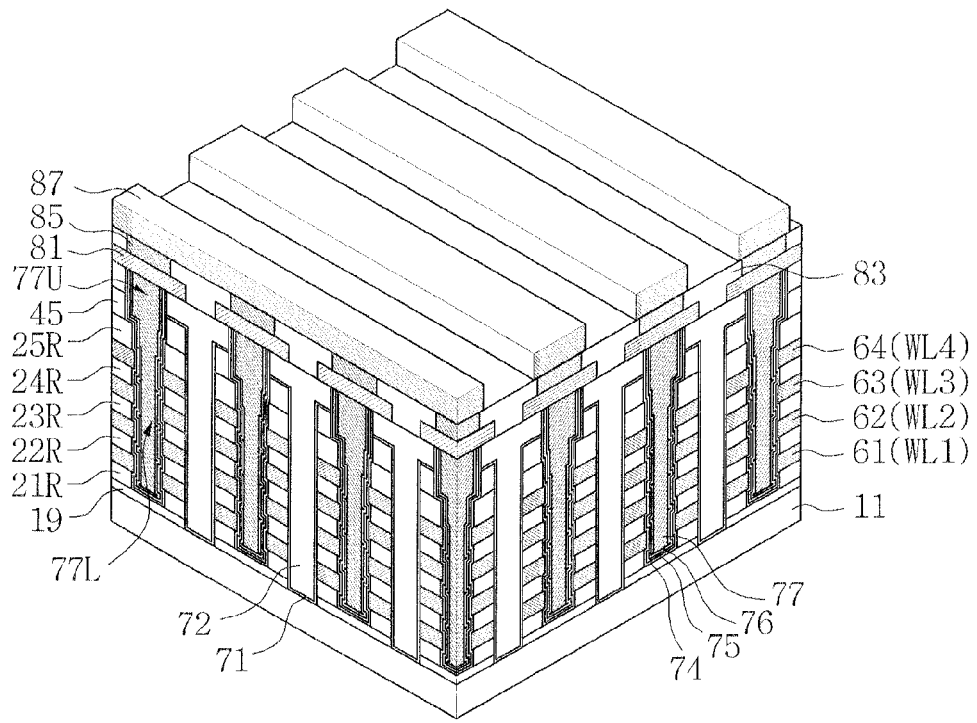
FIGS. 9 and 10 are a perspective view and a cross-sectional view of a non-volatile memory device according to an example embodiment of the inventive concept, respectively.
Figure 10:
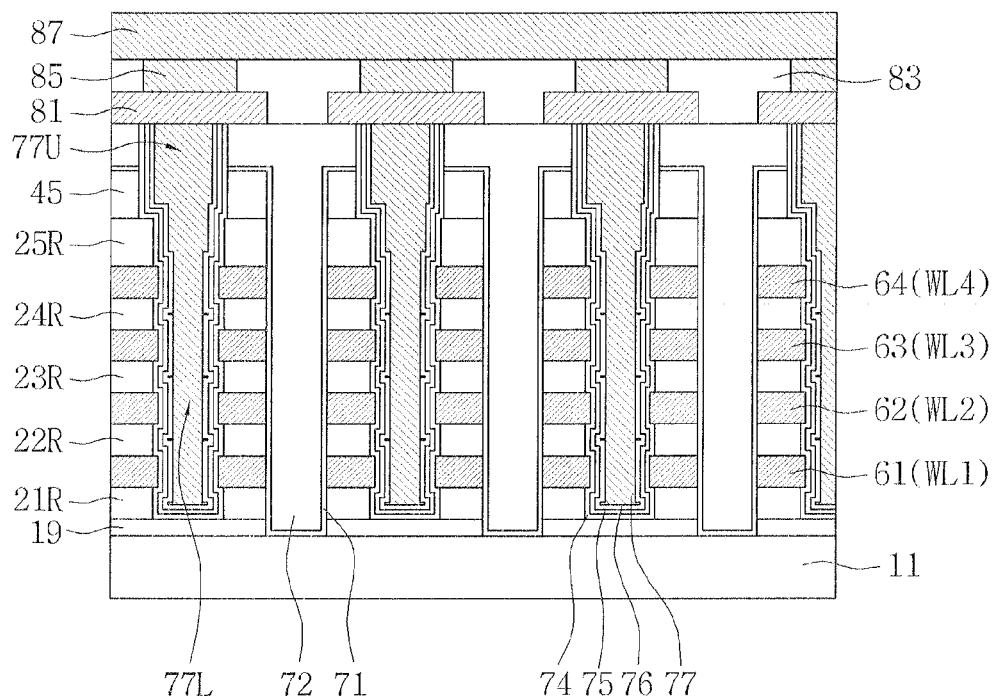

FIG. 9 is a perspective view of a non-volatile memory device according to an example embodiment of the inventive concept, and FIG. 10 is a cross-sectional view of a vertical section of FIG. 9.

Referring to FIGS. 9 and 10, molding layers 21R, 22R, 23R, 24R and 25R may be relatively recessed with respect to sidewalls of word lines 61, 62, 63 and 64. That is, the word lines 61 to 64 may be horizontally projected from sidewalls of the molding layers 21R to 25R. In this case, a diode layer 74 and a resistance-changeable element 75 may partially cover top and bottom surfaces of the word lines 61 to 64.

Figure 11:
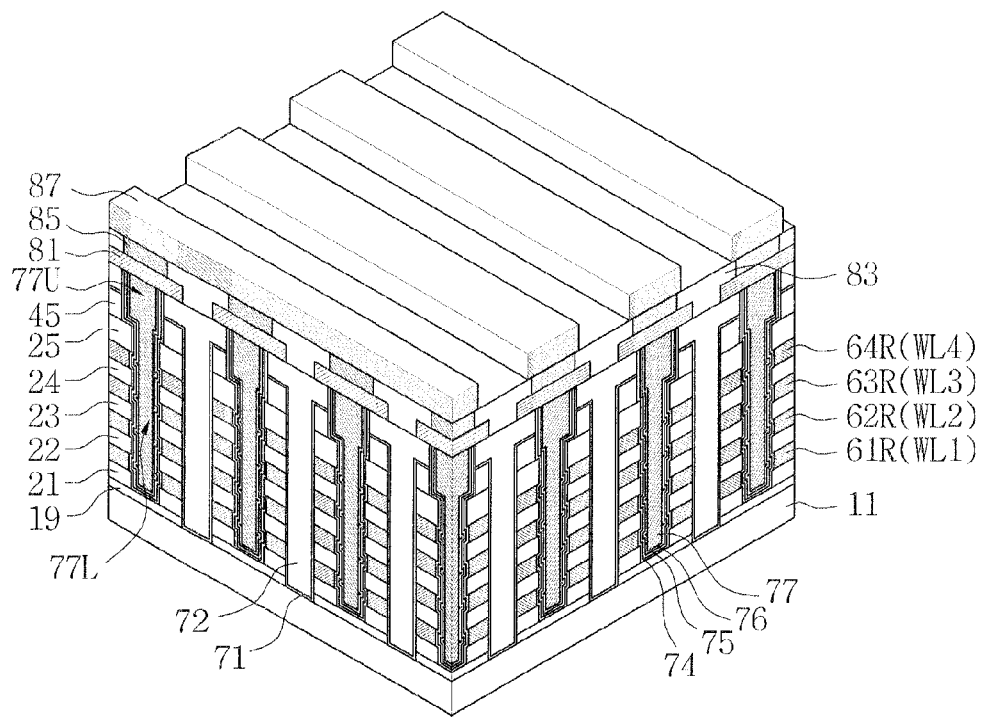
FIGS. 11 and 12 are a perspective view and a cross-sectional view of a non-volatile memory device according to an example embodiment of the inventive concept, respectively.
Figure 12:
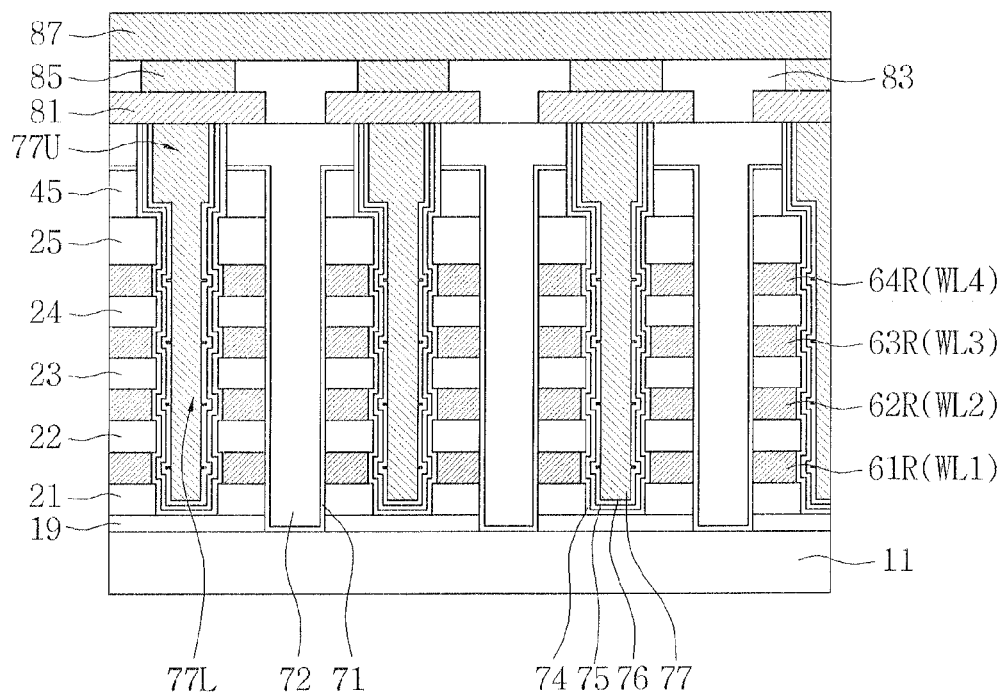

FIG. 11 is a perspective view of a non-volatile memory device according to an example embodiment of the inventive concept, and FIG. 12 is a cross-sectional view of a vertical section of FIG. 11. Referring to FIGS. 11 and 12, word lines 61R, 62R, 63R and 64R may be relatively recessed with respect to sidewalls of molding layers 21, 22, 23, 24 and 25. That is, the molding layers 21 to 25 may be horizontally projected from sidewalls of the word lines 61R to 64R.

Figure 13:
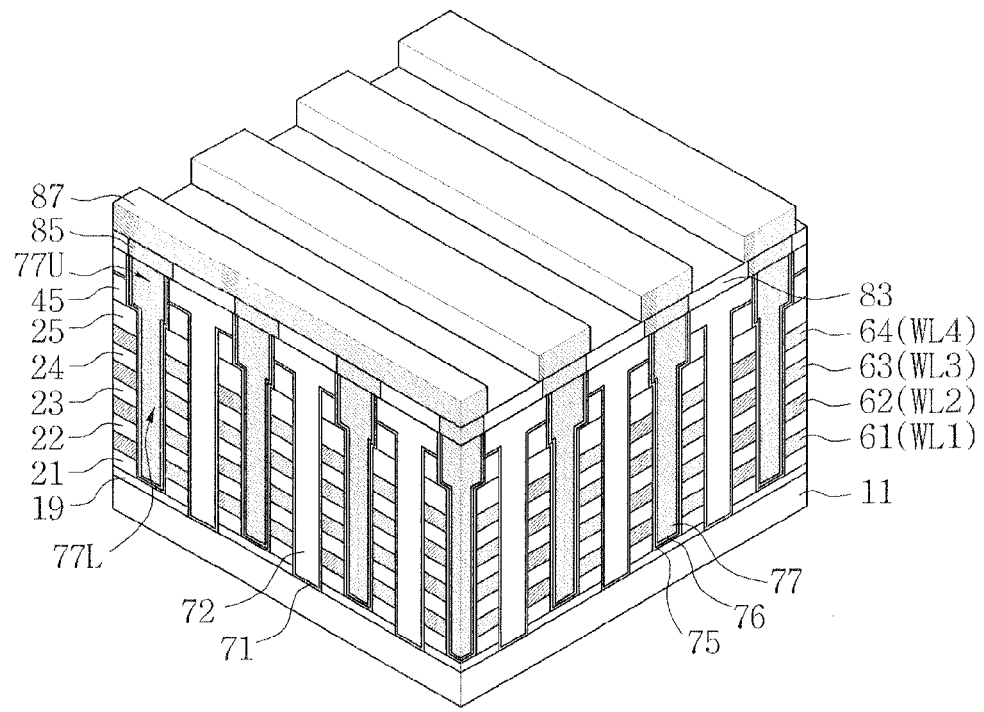
FIGS. 13 and 14 are a perspective view and a cross-sectional view of a non-volatile memory device according to an example embodiment of the inventive concept, respectively.
Figure 14:
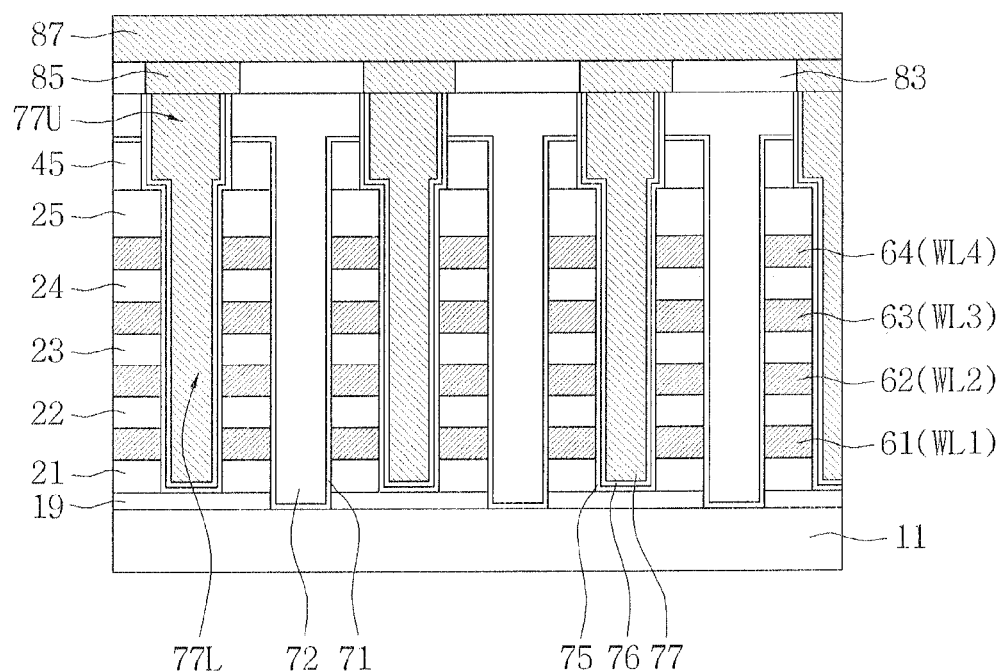

FIG. 13 is a perspective view of a non-volatile memory device according to an example embodiment of the inventive concept, and FIG. 14 is a cross-sectional view of a vertical cross-section of FIG. 13. Referring to FIGS. 13 and 14, an upper part 77U may be connected to a bit plug 85. In this case, the upper part 77U may serve as a bit pad.

Figure 15:
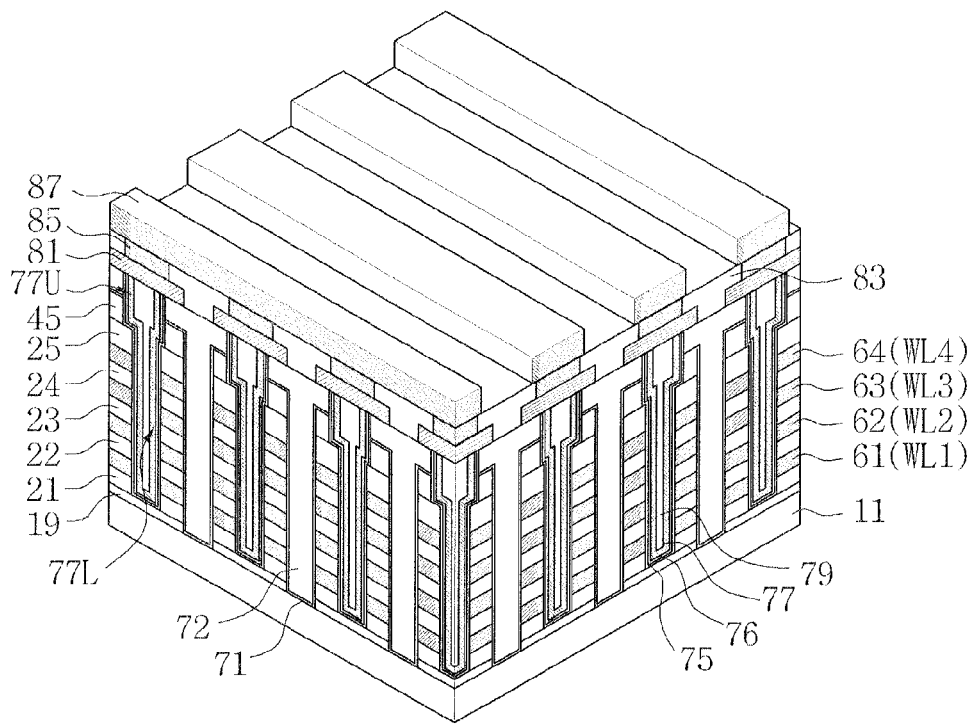
FIGS. 15 and 16 are a perspective view and a cross-sectional view of a non-volatile memory device according to an example embodiment of the inventive concept, respectively.
Figure 16:
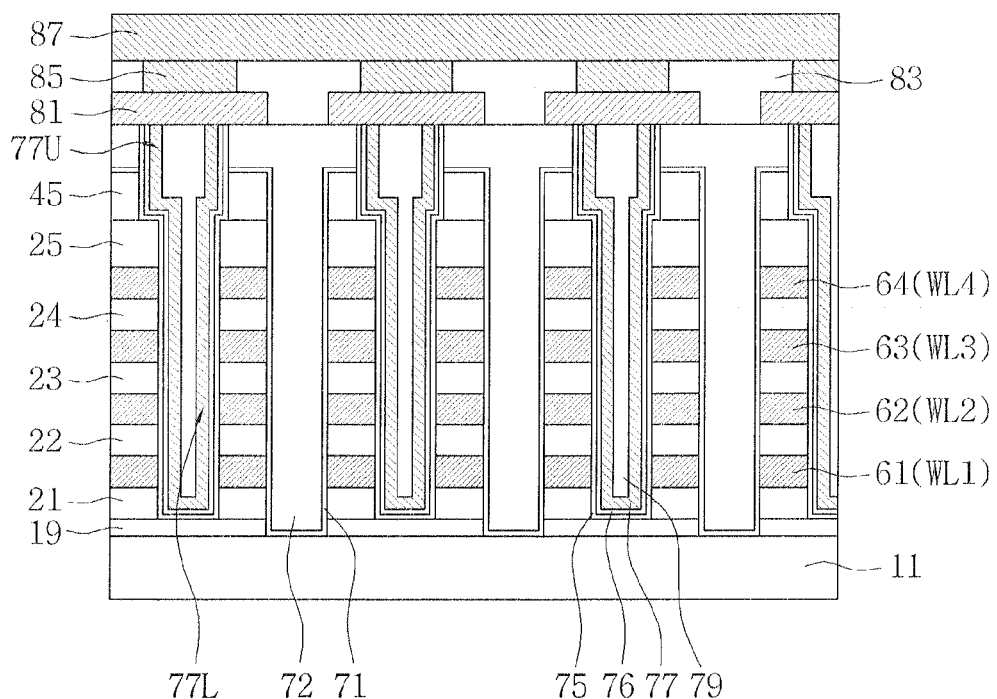

FIG. 15 is a perspective view of a non-volatile memory device according to an example embodiment of the inventive concept, and FIG. 16 is a cross-sectional view of a vertical section of FIG. 15.

Referring to FIGS. 15 and 16, a bit pillar 76, 77 and 79 may include a reactive metal layer 76, an electrode layer 77 and a core 79. The electrode layer 77 may surround the sidewall and bottom of the core 79. The core 79 may include a material having excellent gap-filling characteristics. For example, the core 79 may include a silicon oxide layer, a silicon nitride layer, a silicon oxynitride layer, or a combination thereof. In an example embodiment, the core 79 may include a conductive material such as a metal.

FIGS. 17 to 42 are perspective and cross-sectional views illustrating a method of forming a non-volatile memory device according to an example embodiment of the inventive concept.

Figure 17:
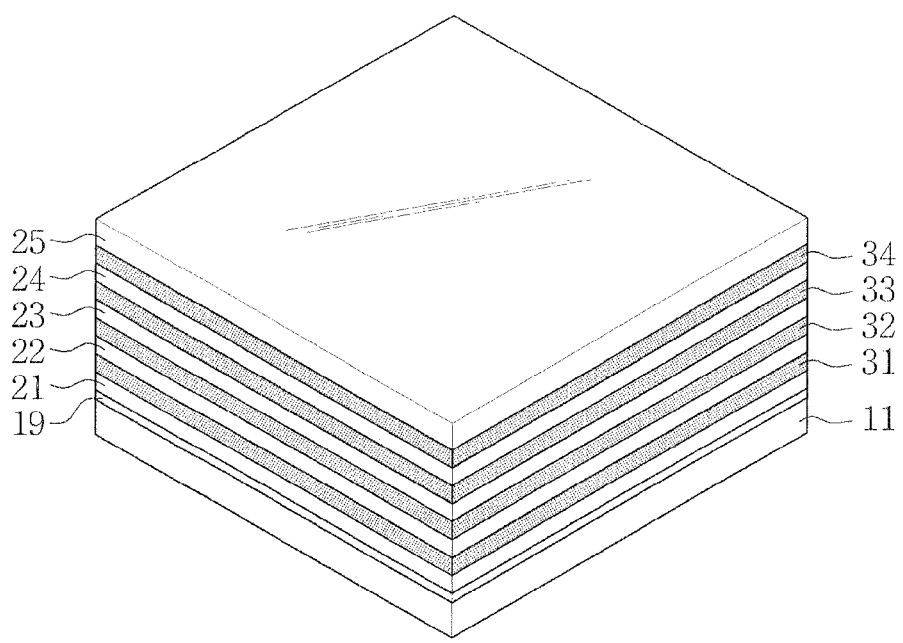
FIGS. 17 to 42 are perspective and cross-sectional views illustrating a method of forming a non-volatile memory device according to an example embodiment of the inventive concept.
Figure 18:
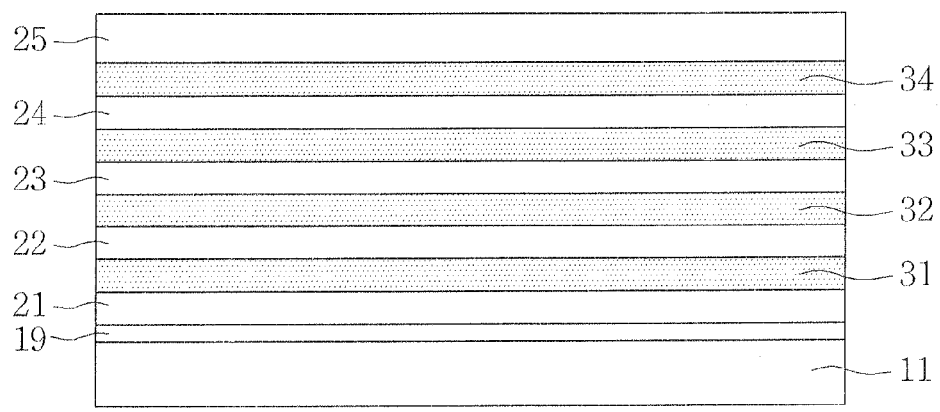

Referring to FIGS. 17 and 18, a buffer layer 19 may be formed on a semiconductor substrate 11. The buffer layer 19 may be a silicon oxide layer formed by chemical vapor deposition (CVD). A plurality of molding layers 21, 22, 23, 24 and 25 and a plurality of sacrificial layers 31, 32, 33 and 34 may be alternately and repeatedly formed on the buffer layer 19. The sacrificial layers 31 to 34 may be material layers having an etch selectivity with respect to the molding layers 21 to 25. For example, the molding layers 21 to 25 may be an oxide layer such as a silicon oxide layer. In this case, the sacrificial layers 31 to 34 may be a silicon nitride layer.

A first molding layer 21 may be formed on the buffer layer 19 by chemical vapor deposition (CVD). A first sacrificial layer 31 may be formed on the first molding layer 21. A second molding layer 22 may be formed on the first sacrificial layer 31. A second sacrificial layer 32 may be formed on the second molding layer 22. A third molding layer 23 may be formed on the second sacrificial layer 32. A third sacrificial layer 33 may be formed on the third molding layer 23. A fourth molding layer 24 may be formed on the third sacrificial layer 33. A fourth sacrificial layer 34 may be formed on the fourth molding layer 24. A fifth molding layer 25 may be formed on the fourth sacrificial layer 34.

Figure 19:
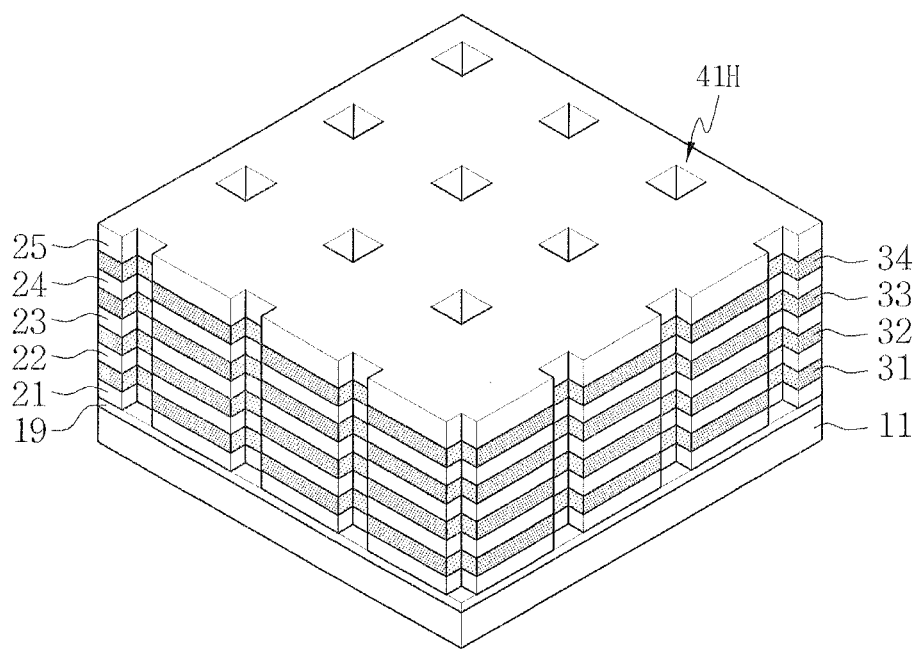
Figure 20:
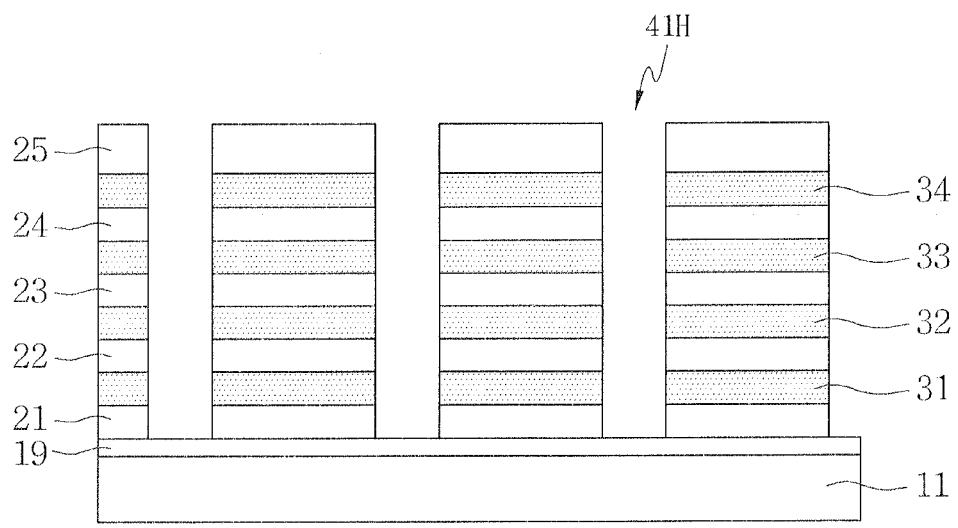

Referring to FIGS. 19 and 20, a bit hole 41H passing through the molding layers 21 to 25 and the sacrificial layers 31 to 34 may be formed. A plurality of bit holes 41H may be formed and two-dimensionally arranged in columns and rows. The bit hole 41H may be perpendicular to a surface of the semiconductor substrate 11. The bit hole 41H may be formed in various shapes such as an inverted trapezoidal shape in which an upper width is larger than a lower width, but herein, for simplicity, an upper part and a lower part will have the same width.

Figure 21:
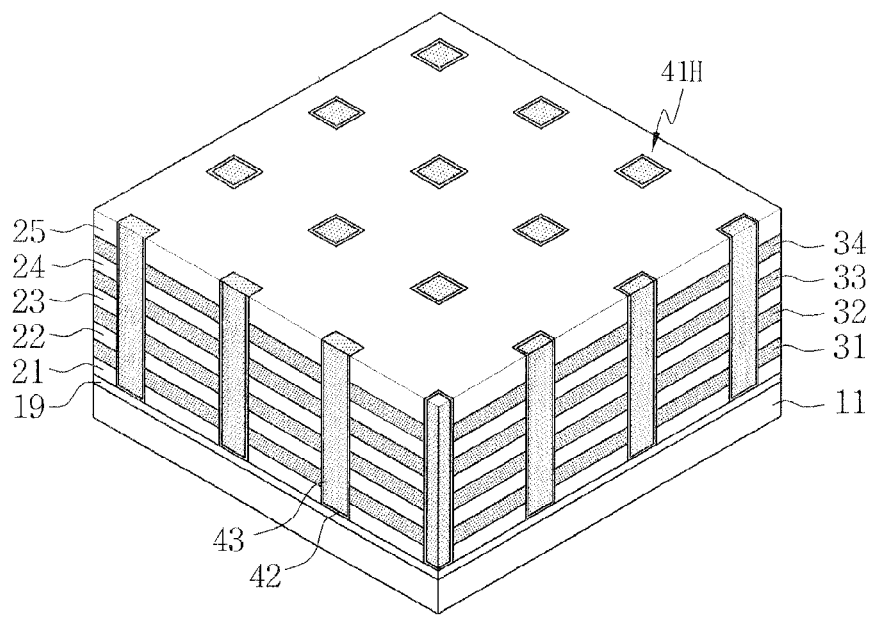
Figure 22:
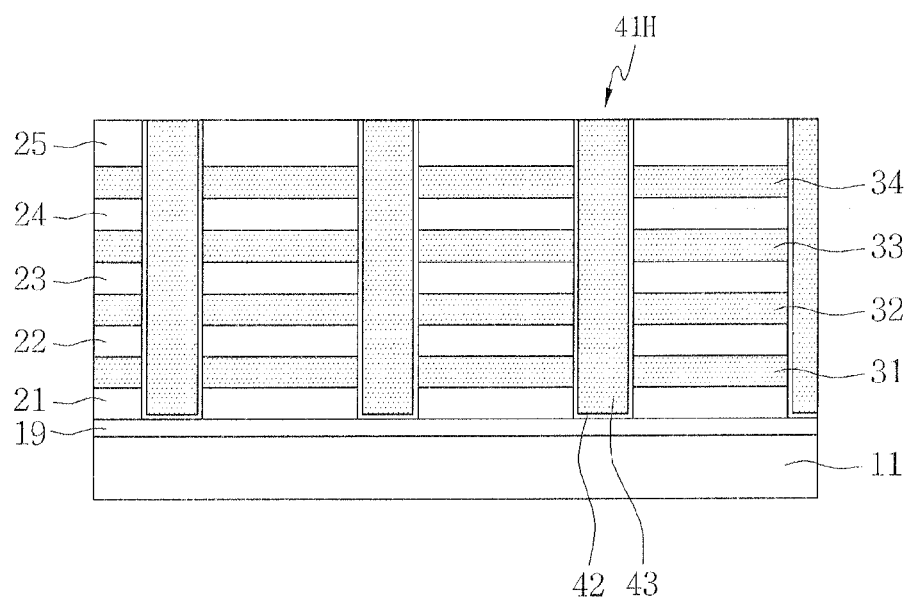

Referring to FIGS. 21 and 22, sacrificial plugs 42 and 43 may be formed in the bit hole 41H. The sacrificial plugs 42 and 43 may include a first sacrificial plug 42 and a second sacrificial plug 43. The first sacrificial plug 42 may surround the sidewall and bottom of the second sacrificial plug 43. The sacrificial plugs 42 and 43 may be formed by a thin-film forming process and a chemical mechanical polishing (CMP) process.

The sacrificial plugs 42 and 43 may include a material having an etch selectivity with respect to the molding layers 21 to 25. The first sacrificial plug 42 may include a material having an etch selectivity with respect to the sacrificial layers 31 to 34. For example, the second sacrificial plug 43 may be a silicon nitride layer, and the first sacrificial plug 42 may be a silicon oxide layer. The first sacrificial plug 42 may be formed to have a smaller thickness than the second sacrificial plug 43. The second sacrificial plug 43 may completely fill the bit hole 41H.

Figure 23:
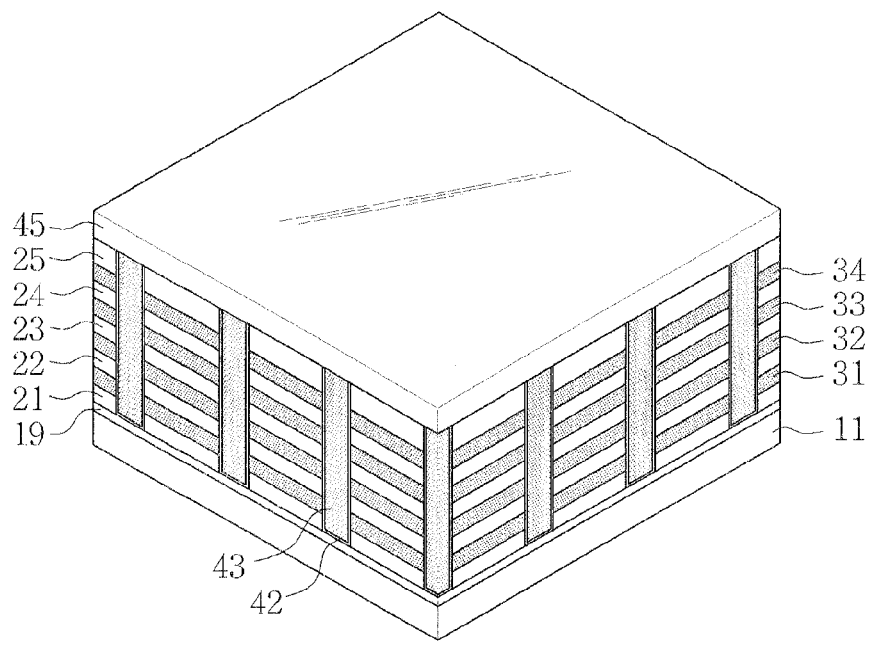
Figure 24:
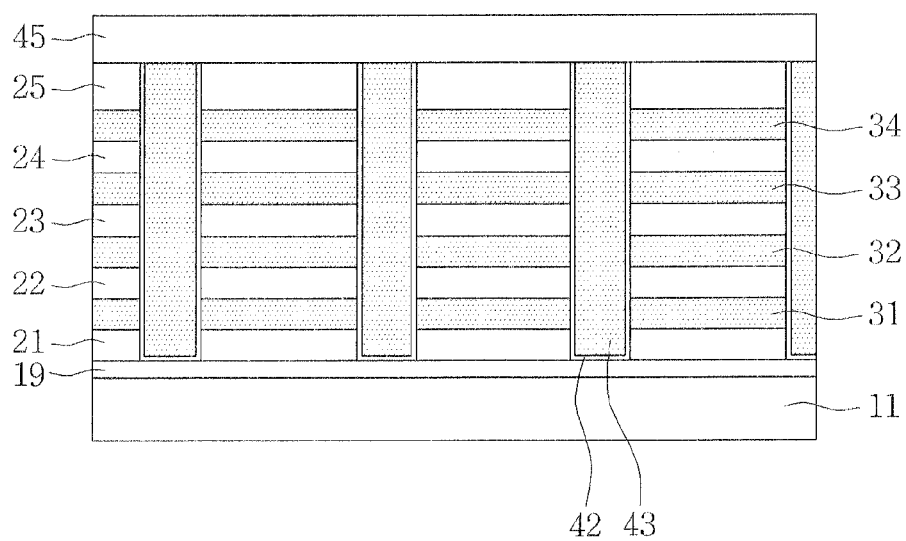

Referring to FIGS. 23 and 24, a first interlayer insulating layer 45 may be formed on the semiconductor substrate 11 having the sacrificial plugs 42 and 43. The first interlayer insulating layer 45 may cover the fifth molding layer 25 and the sacrificial plugs 42 and 43. The first interlayer insulating layer 45 may include a material having an etch selectivity with respect to the sacrificial layers 31 to 34. For example, the first interlayer insulating layer 45 may be a silicon oxide layer.

Figure 25:
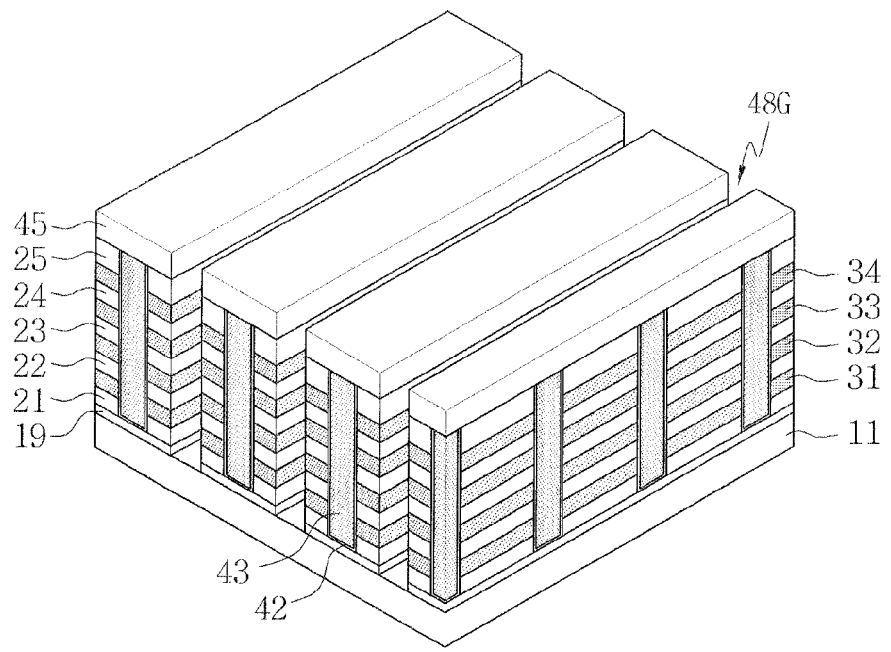
Figure 26:
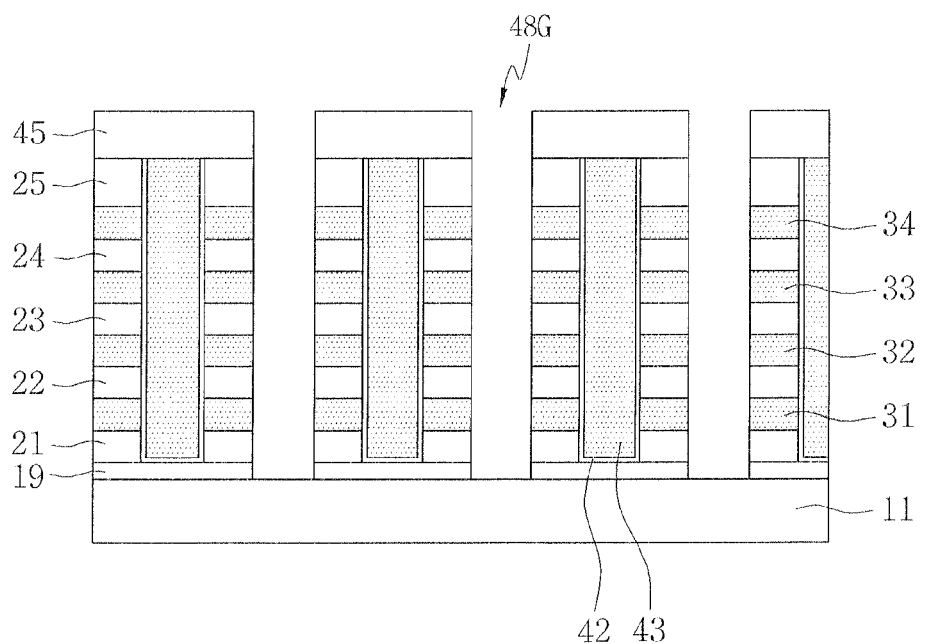

Referring to FIGS. 25 and 26, a first groove 48G may be formed by patterning the first interlayer insulating layer 45, the molding layers 21 to 25, the sacrificial layers 31 to 34 and the buffer layer 19. A plurality of first grooves 48G may be formed parallel to each other. The sacrificial layers 31 to 34 may be exposed to sidewalls of the first groove 48G. The first interlayer insulating layer 45 may cover the sacrificial plugs 42 and 43.

Figure 27:
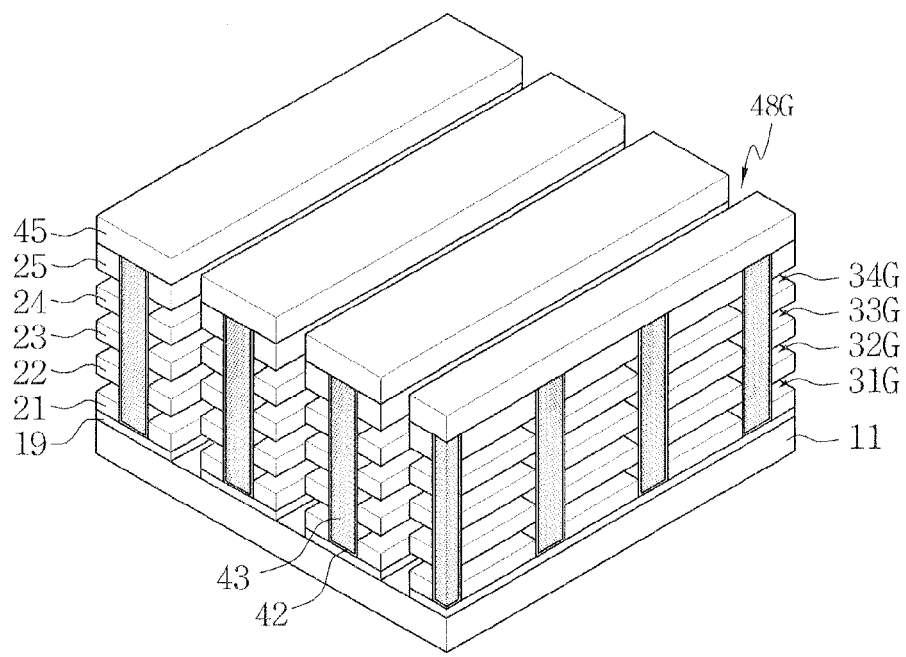
Figure 28:
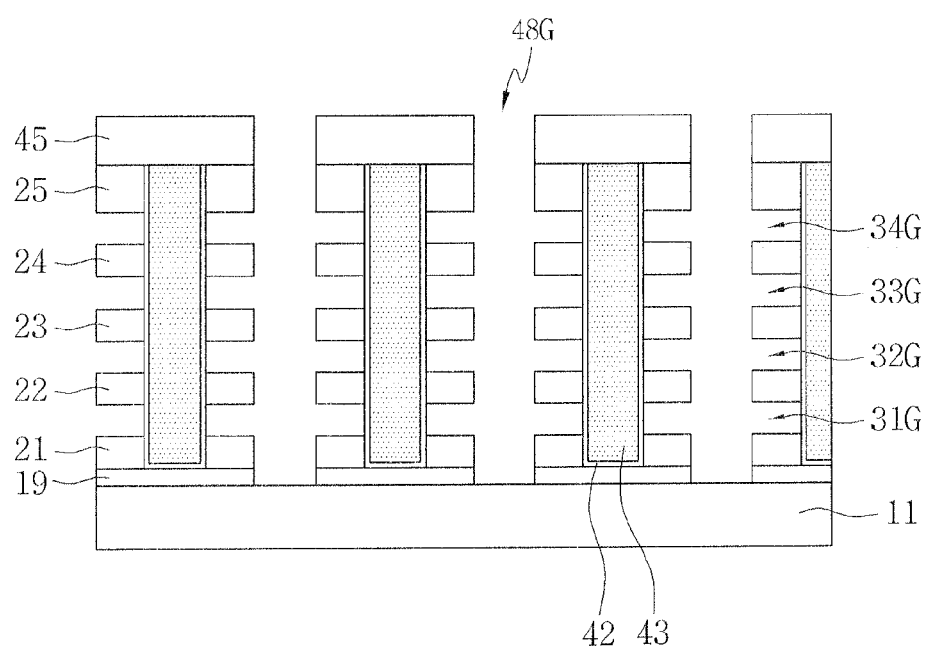

Referring to FIGS. 27 and 28, slits 31G, 32G, 33G and 34G may be formed by removing the sacrificial layers 31 to 34. The slits 31G to 34G may be formed between the moldings 21 and 25 by a pull-back process such as isotropic etching. The first sacrificial plug 42 may be exposed in the slits 31G to 34G.

Figure 29:
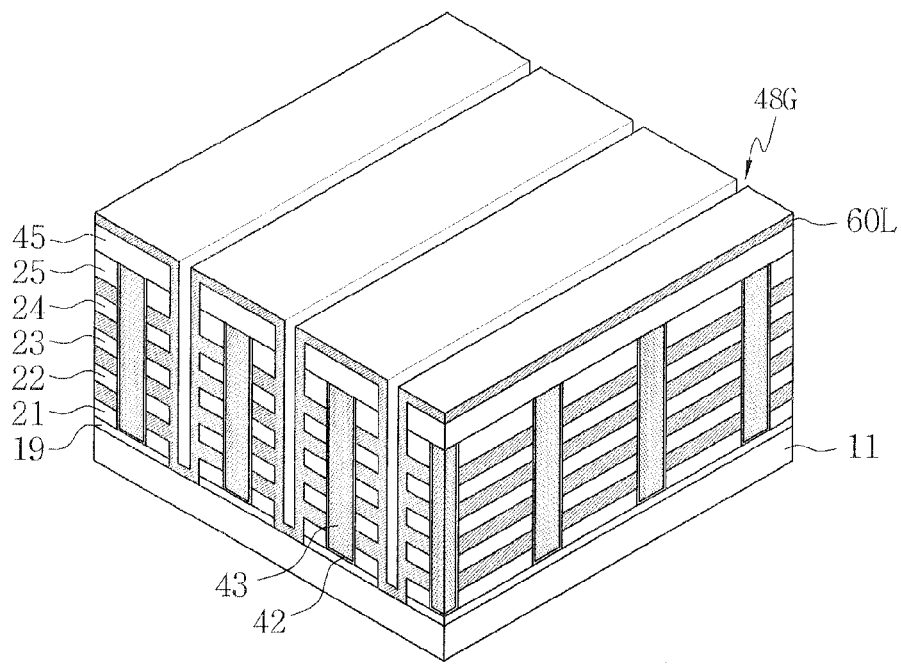
Figure 30:
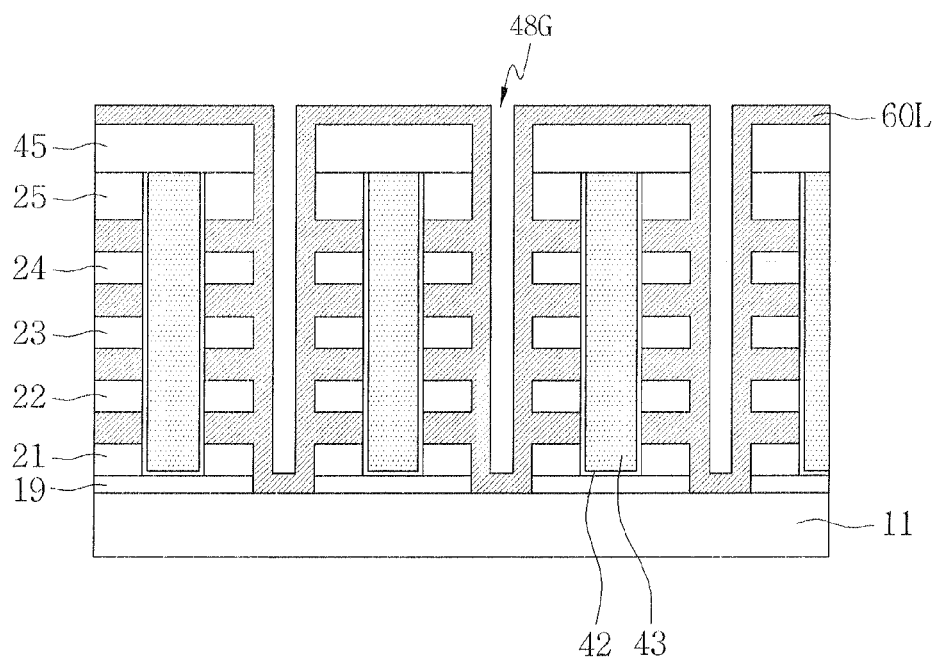

Referring to FIGS. 29 and 30, a word conductive layer 60L may be formed in the slits 31G to 34G and the first groove 48G. The word conductive layer 60L may include Ru, W, Ti, TiN, TiAlN, TiSi, TiSiN, Ta, TaN, Hf or Zr. The word conductive layer 60L may completely fill the slits 31G to 34G. The word conductive layer 60L may cover a sidewall of the first groove 48G.

In an example embodiment, the word conductive layer 60L may include polysilicon.

Figure 31:
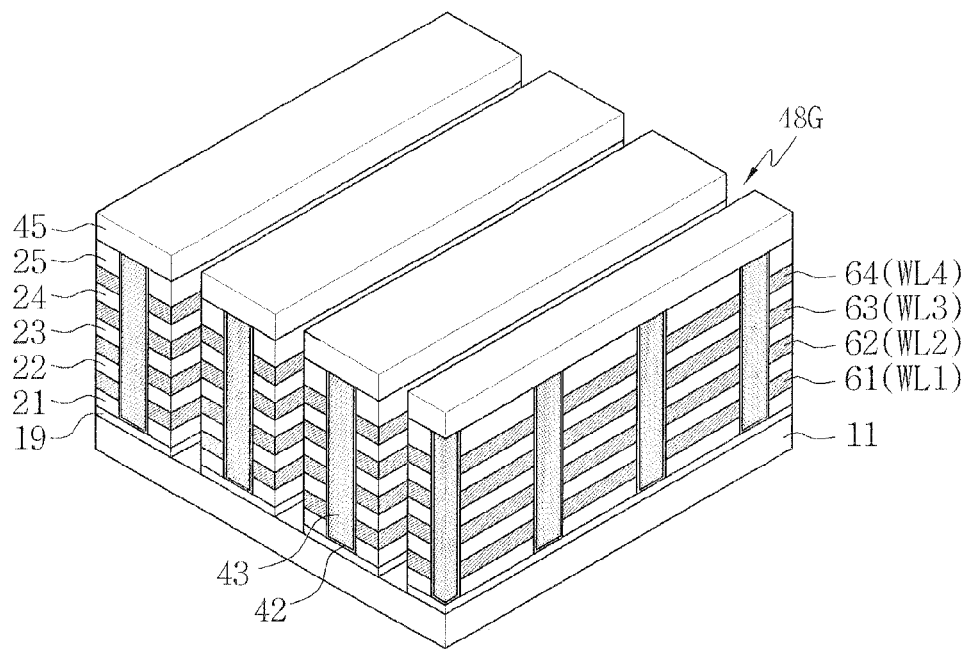
Figure 32:
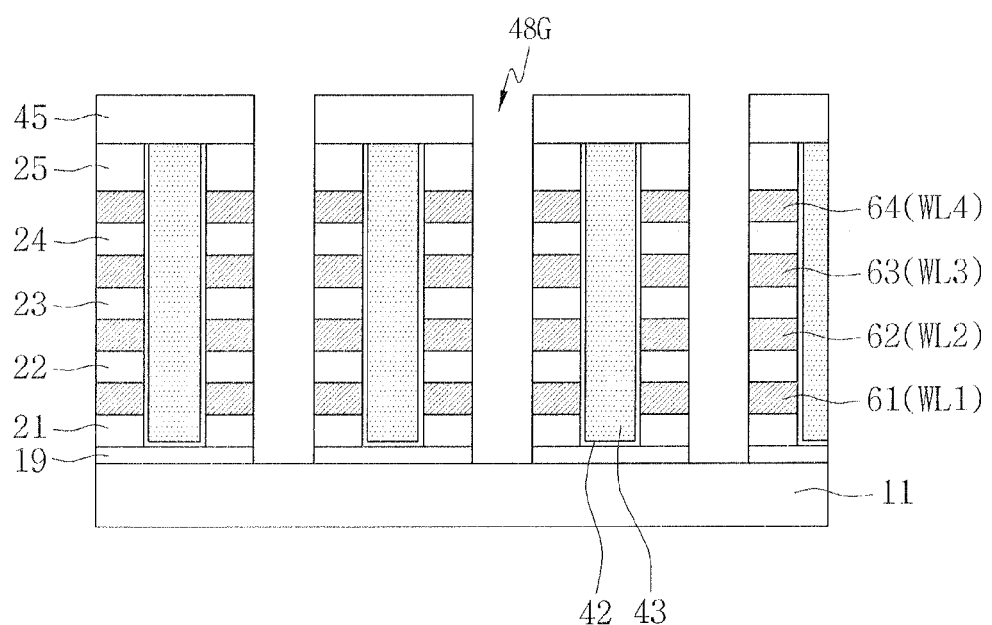

Referring to FIGS. 31 and 32, word lines 61, 62, 63 and 64 may be formed in the slits 31G to 34G by partially removing the word conductive layer 60L. To remove the word conductive layer 60L, a trimming process may be applied. As a result, the word lines 61 to 64 and the molding layers 21 to 25 may be exposed to sidewalls of the first groove 48G.

Figure 33:
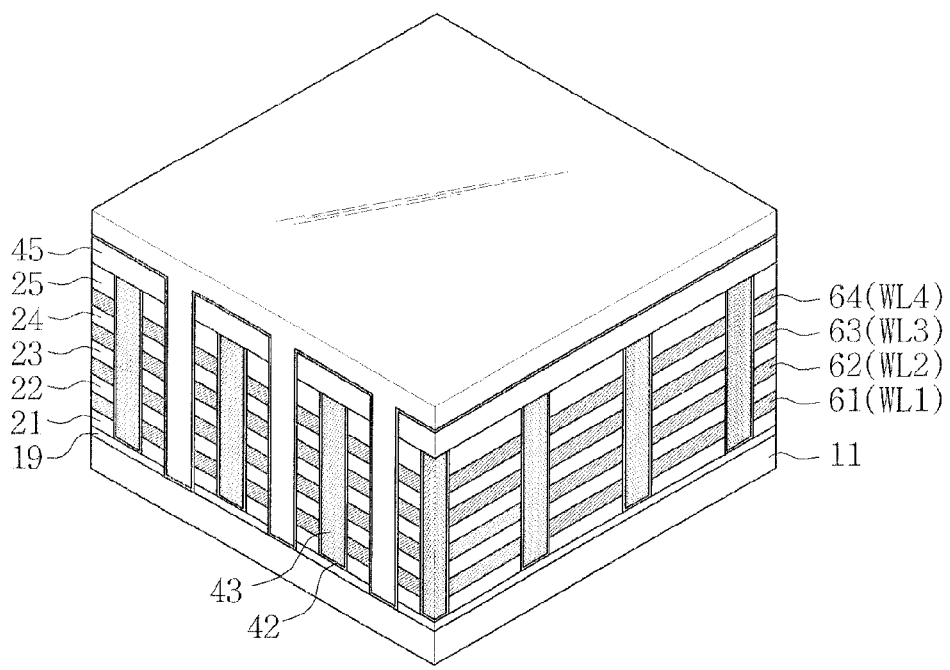
Figure 34:
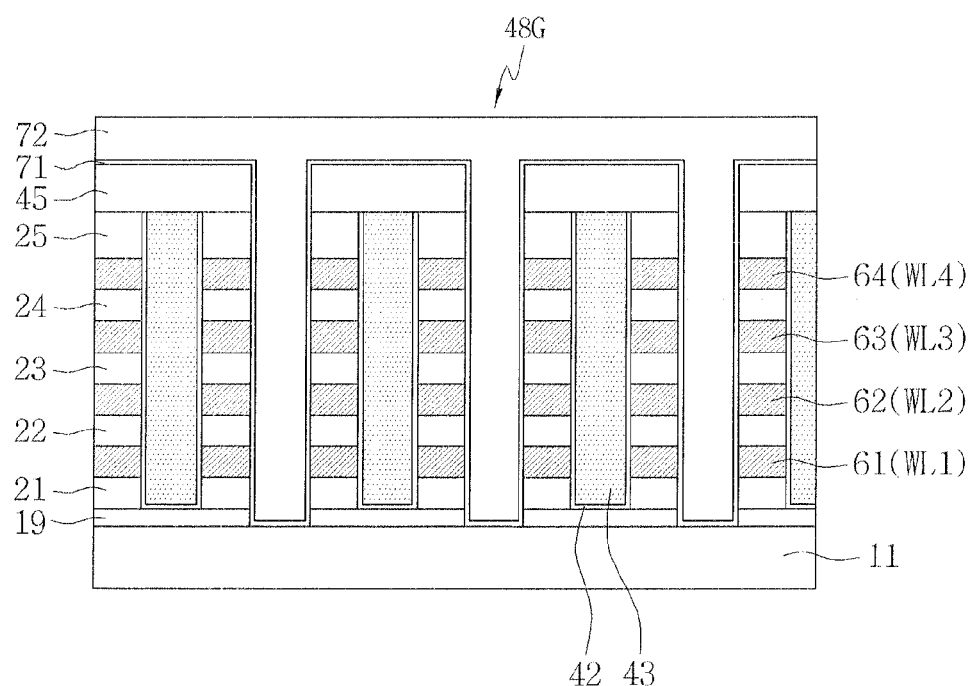

Referring to FIGS. 33 and 34, second interlayer insulating layers 71 and 72 completely filling the first groove 48G and covering a top surface of the first interlayer insulating layer 45 may be formed. The second interlayer insulating layers 71 and 72 may include a silicon oxide layer, a silicon nitride layer, a silicon oxynitride layer or a combination thereof. For example, the second interlayer insulating layers 71 and 72 may include a nitride layer 71 and an oxide layer 72, which are sequentially stacked. Top surfaces of the second interlayer insulating layers 71 and 72 may be planarized.

Figure 35:
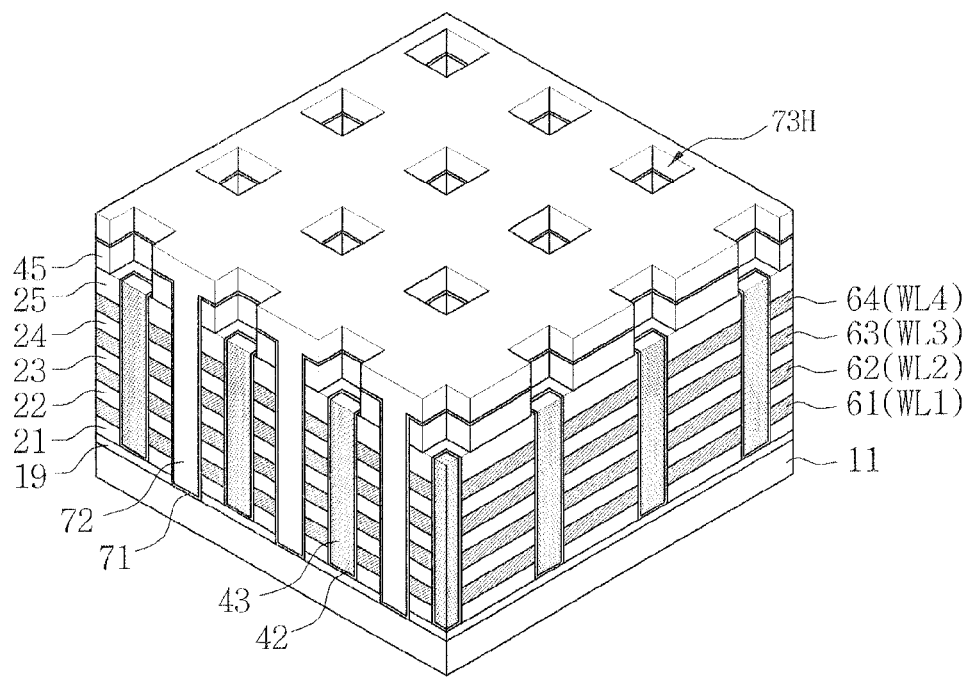
Figure 36:
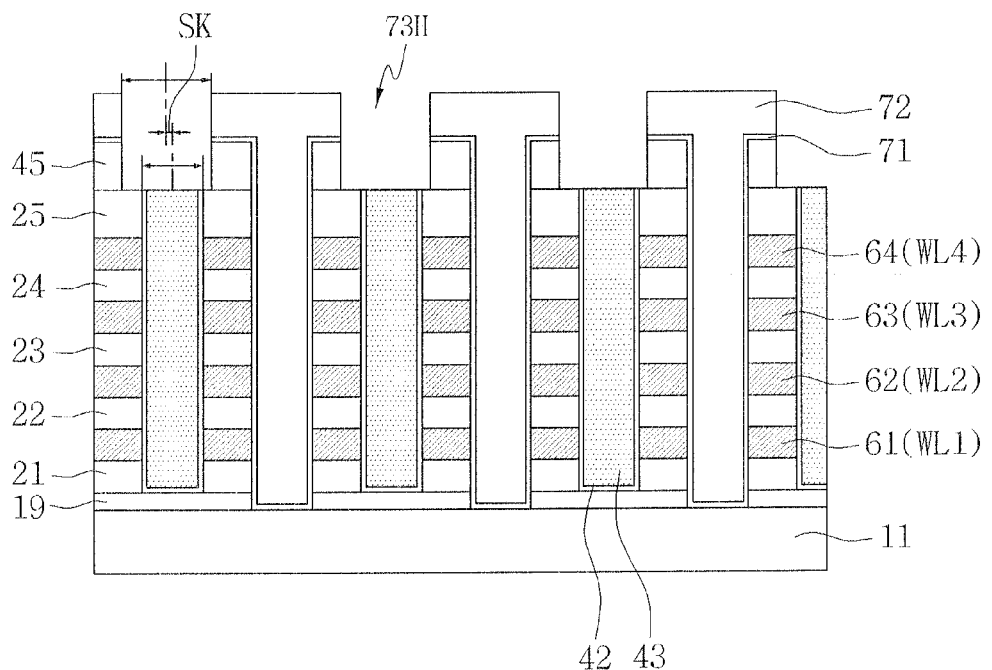

Referring to FIGS. 35 and 36, a bit opening 73H exposing the sacrificial plugs 42 and 43 may be formed by patterning the second interlayer insulating layers 71 and 72 and the first interlayer insulating layer 45. Photolithography and anisotropic etching may be applied to pattern the second interlayer insulating layers 71 and 72 and the first interlayer insulating layer 45. In this case, the bit opening 73H may have an alignment error (SK). For example, a central axis of the bit opening 73H may be mislocated by a distance corresponding to the alignment error (SK) from a central axis of the sacrificial plugs 42 and 43.

Figure 37:
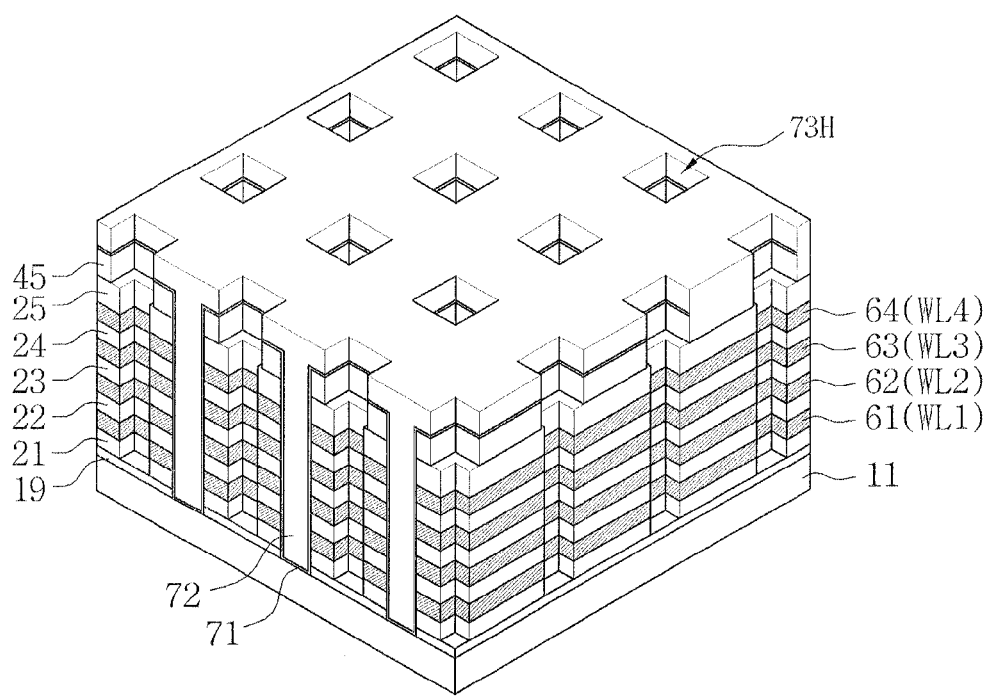
Figure 38:
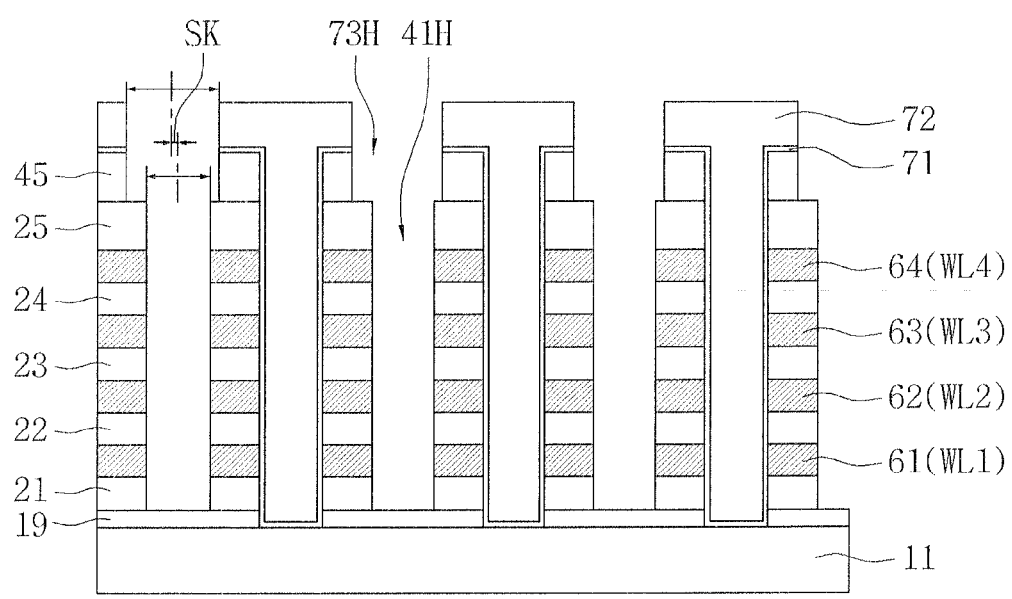

Referring to FIGS. 37 and 38, the bit hole 41H may be exposed by removing the sacrificial plugs 42 and 43. As described above, due to the alignment error (SK), a central axis of the bit opening 73H may not be matched with a central axis of the bit hole 41H. That is, the bit opening 73H and the bit hole 41H may be misaligned. The word lines 61 to 64 and the molding layers 21 to 25 may be exposed to sidewalls of the bit hole 41H.

Figure 39:
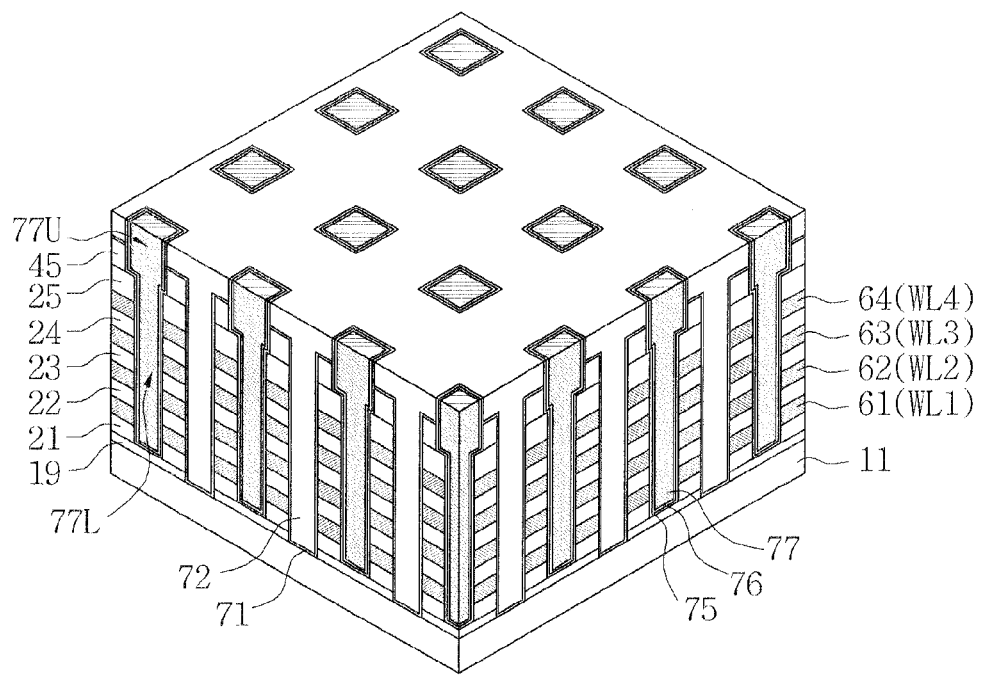
Figure 40:
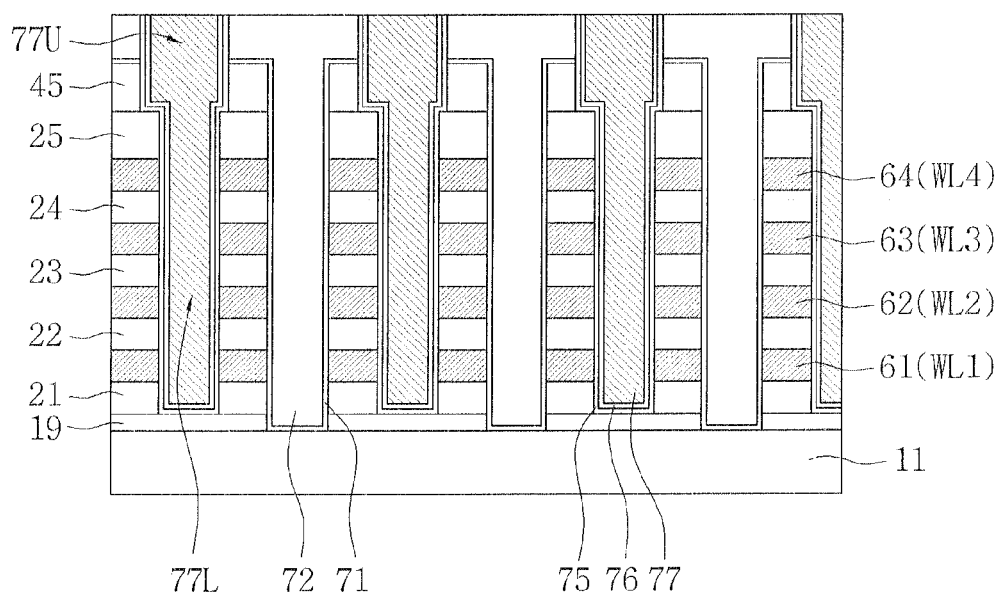

Referring to FIGS. 39 and 40, a resistance-changeable element 75 and a bit pillar 76 and 77 may be formed in the bit hole 41H and the bit opening 73H. The bit pillar 76 and 77 may include a reactive metal layer 76 and an electrode layer 77. The reactive metal layer 76 may be formed to surround the sidewall and bottom of the electrode layer 77. The resistance-changeable element 75 may be formed to surround the sidewall and bottom of the bit pillar 76 and 77. The reactive metal layer 76 may be formed between the resistance-changeable element 75 and the electrode layer 77. The reactive metal layer 76 may be in contact with the resistance-changeable element 75. The bit pillar 76 and 77 may be divided into an upper part 77U and a lower part 77L. The upper part 77U may correspond to the bit opening 73H, and the lower part 77L may correspond to the bit hole 41H.

The resistance-changeable element 75 may include a transition metal oxide (TMO) layer such as a TiO layer, a TaO layer, a NiO layer, a ZrO layer, a MO layer or a combination layer thereof. The reactive metal layer 76 may include Ti, Ta, Hf, Zr or a combination thereof. The electrode layer 77 may include Ru, W, Ti, TiN, TiAlN, TiSi, TiSiN, Ta, TaN, Hf, Zr or a combination thereof.

Figure 41:
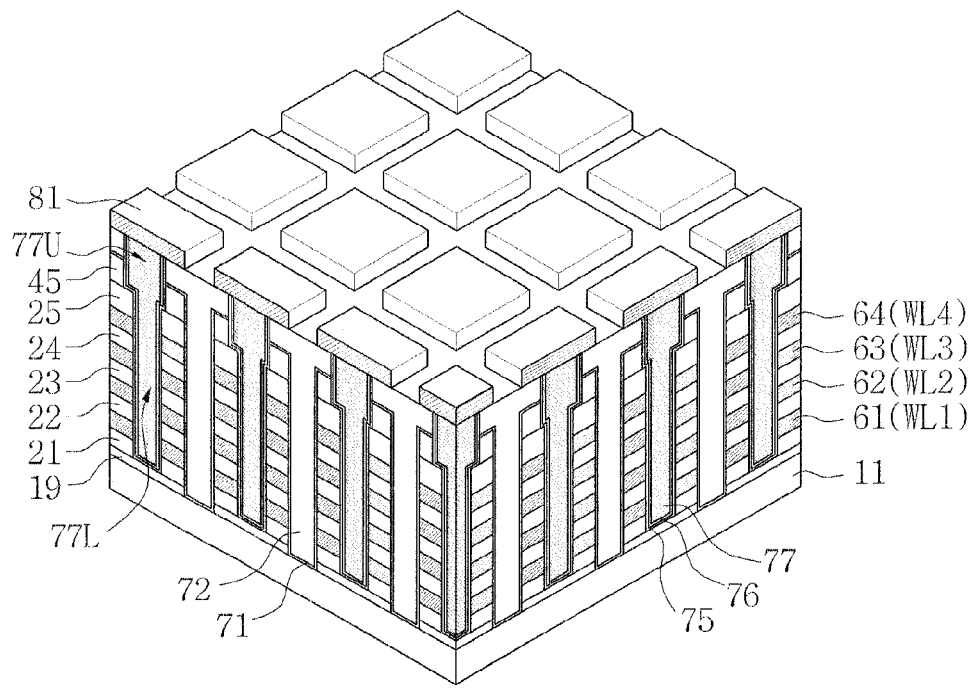
Figure 42:
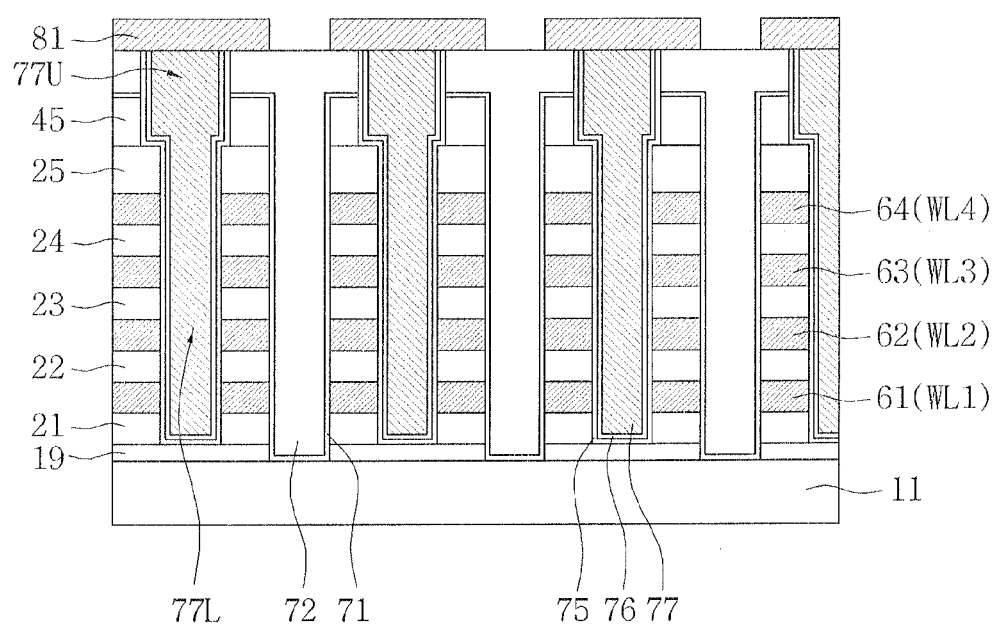

Referring to FIGS. 41 and 42, a bit pad 81 covering the upper part 77U may be formed on the second interlayer insulating layers 71 and 72. The bit pad 81 may be formed of a conductive material layer such as a metal layer.

Referring again to FIGS. 1 and 2, an upper insulating layer 83 may be formed on the semiconductor substrate 11 having the bit pad 81. A bit plug 85 in contact with the bit pad 81 through the upper insulating layer 83 may be formed. A bit line 87 in contact with the bit plug 85 may be formed on the upper insulating layer 83.

Meanwhile, the resistance-changeable element 75 may have high resistivity or low resistivity according to application of an electrical signal. For example, when the resistance-changeable element 75 is a transition metal oxide (TMO) layer such as a TiO layer, a TaO layer, an NiO layer, a ZrO layer, or a HfO layer, the resistance-changeable element 75 may exhibit high resistivity in a reset state. When a write current flows in the resistance-changeable element 75, a pathway through which the current may flow may be generated in the resistance-changeable element 75, and thus the resistance-changeable element 75 may have low resistivity. When a read current lower than the write current flows in the resistance-changeable element 75, the resistance-changeable element 75 may continuously have low resistivity. When a reset current higher than the write current flows in the resistance-changeable element 75, the resistance-changeable element 75 may have high resistivity.

According to an example embodiment of the inventive concept, during the formation of the word lines 61 to 64, the sacrificial plugs 42 and 43 may be retained in the bit hole 41H. A process of forming the word lines 61 to 64 may include an etching process to remove the sacrificial layers 31 to 34. In addition, the process of forming the word lines 61 to 64 may include a high temperature process. As a result, the resistance-changeable element 75 may avoid the high temperature process and etching process. Accordingly, a non-volatile memory device having an excellent electrical characteristic may be formed.

Figure 43:
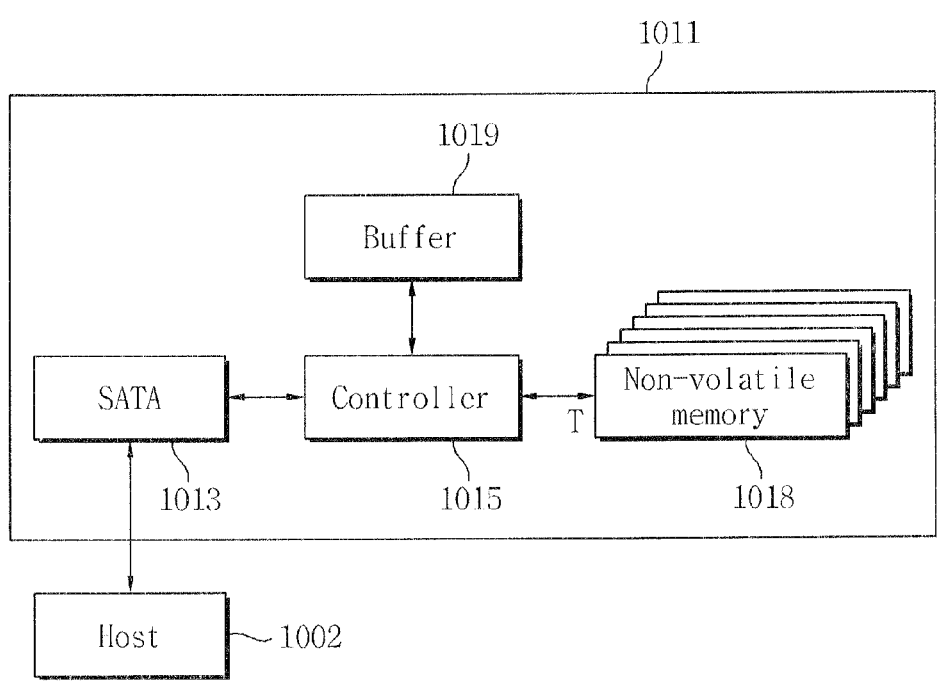
FIG. 43 is a system block diagram of an electronic device according to an example embodiment of the inventive concept.

FIG. 43 is a system block diagram of an electronic device according to an example embodiment of the inventive concept. The electronic device may be a data storage device such as a solid state disk (SSD) 1011.

Referring to FIG. 43, the SSD 1011 may include an interface 1013, a controller 1015, a non-volatile memory 1018 and a buffer memory 1019.

The SSD 1011 is a device which stores data using a semiconductor device. The SSD 1011 has a higher speed, and lower mechanical delay, lower failure rate and lower heat and noise characteristics, and is compact in size and light weight compared to a hard disk drive (HDD). The SSD 1011 may be largely used in notebook PCs, netbooks, desktop PCs, MP3 players or portable storage devices.

The controller 1015 may be formed adjacent to and electrically connected to the interface 1013. The controller 1015 may be a microprocessor including a memory controller and a buffer controller. The non-volatile memory 1018 may be formed adjacent to and electrically connected to the controller 1015 via a connection terminal T. Data storage capacity of the SSD 1011 may correspond to the non-volatile memory 1018. The buffer memory 1019 may be formed adjacent to and electrically connected to the controller 1015.

The interface 1013 may be connected to a host 1002, and serve to send and/or receive electrical signals such as data. For example, the interface 1013 may be a device using a specification such as serial advanced technology attachment (SAGA), integrated drive electronics (IDE), small computer system interface (SCSI), and/or a combination thereof. The non-volatile memory 1018 may be connected to the interface 1013 via the controller 1015. The non-volatile memory 1018 may serve to store data received through the interface 1013. Even if power supply to the SSD 1011 is interrupted, the data stored in the non-volatile memory 1018 is retained.

The buffer memory 1019 may include a volatile memory. The volatile memory may be a dynamic random access memory (DRAM) and/or a static random access memory (SRAM). The buffer memory 1019 may exhibit a relatively faster operating speed than the non-volatile memory 1018.

The data processing speed of the interface 1013 may be relatively faster than the operating speed of the non-volatile memory 1018. Here, the buffer memory 1019 may serve to temporarily store data. The data received from the interface 1013 may be temporarily stored in the buffer memory 1019 via the controller 1015, and permanently stored in the non-volatile memory 1018 at a data write speed of the non-volatile memory 1018. Frequently used data of the data stored in the non-volatile memory 1018 may be previously read and then temporarily stored in the buffer memory 1019. In other words, the buffer memory 1019 may serve to increase an effective operating speed of the SSD 1011 and reduce an error rate.

The non-volatile memory 1018 may include a semiconductor device similar to that described with reference to FIGS. 1 to 42. For example, the non-volatile memory 1018 may include the resistance-changeable element 75, the word lines 61 to 64 and the bit pillar 76 and 77. The resistance-changeable element 75 may be electrically connected to the controller 1015 via the bit pillar 76 and 77, the bit line 87 and the connection terminal T. The resistance-changeable element 75 has superior electrical characteristics compared to the conventional art. Accordingly, the SSD 1011 having excellent electrical characteristics may be realized.

Figure 44:
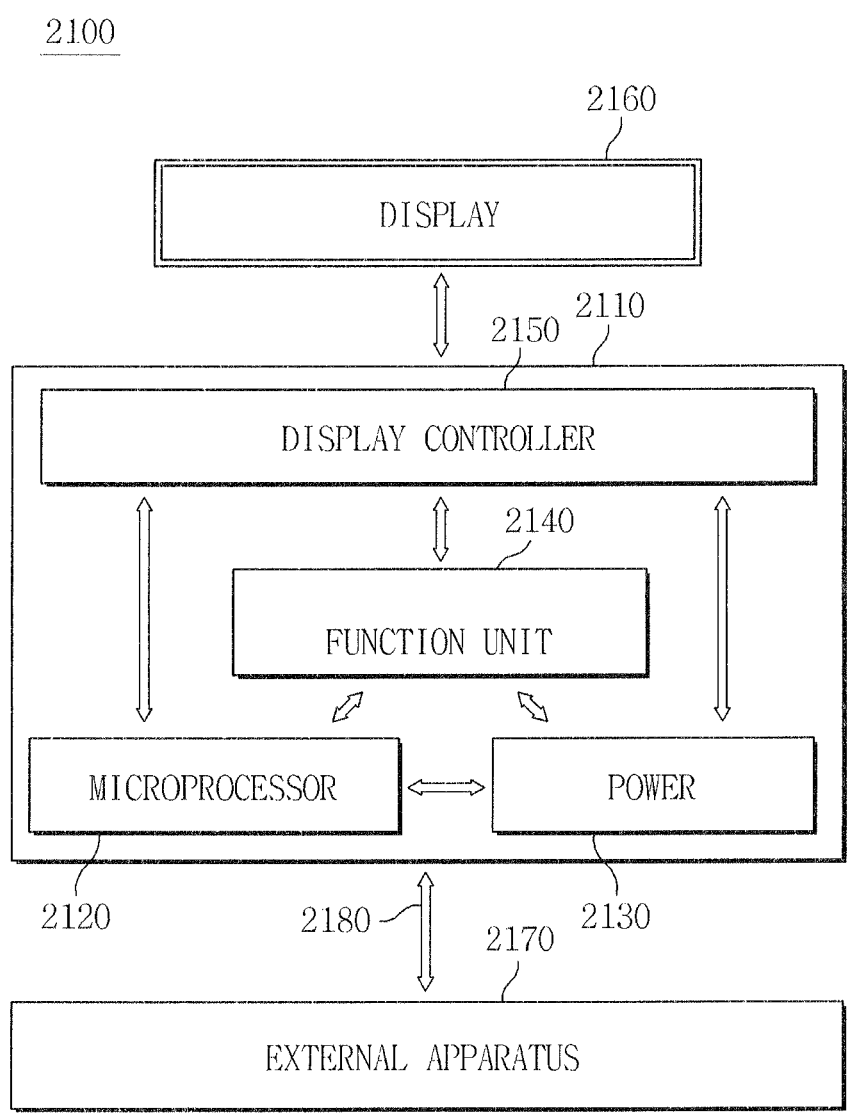
FIG. 44 is a system block diagram of an electronic device according to an example embodiment of the inventive concept.

FIG. 44 is a system block diagram of an electronic device according to an eleventh example embodiment of the inventive concept.

Referring to FIG. 44, a semiconductor device similar to that described with reference to FIGS. 1 to 22 may be applied to an electronic system 2100. The electronic system 2100 may include a body 2110, a micro processor unit 2120, a power unit 2130, a functional unit 2140, and a display controller unit 2150. The body 2110 may be a mother board formed of a printed circuit board (PCB). The micro processor unit 2120, the power unit 2130, the functional unit 2140, and the display controller unit 2150 may be installed in the body 2110. A display unit 2160 may be disposed inside or outside the body 2110. For example, the display unit 2160 may be disposed on a surface of the body 2110 to display an image processed by the display controller unit 2150.

The power unit 2130 may serve to distribute a predetermined voltage, which is supplied from an external battery (not shown) and then branched according to a required voltage level, to the micro processor unit 2120, the functional unit 2140, and the display controller unit 2150. The micro processor unit 2120 may receive a voltage from the power unit 2130, and control the functional unit 2140 and the display unit 2160. The functional unit 2140 may perform various functions of the electronic system 2100. For example, when the electronic system 2100 is a mobile phone, the functional unit 2140 may include various components capable of performing a mobile function such as dialing, the output of an image to the display unit 2160 and the output of a sound to a speaker by communication with an external apparatus 2170, and when a camera is installed together within the electronic system 2100, the functional unit 2140 may serve as a camera image processor.

In an example embodiment, when the electronic system 2100 is connected to a memory card to increase its capacity, the functional unit 2140 may be a memory card controller. The functional unit 2140 may send and/or receive signals to and/or from the external apparatus 2170 through a wired or wireless communication unit 2180. Further, when the electronic system 2100 requires a universal serial bus (USB) to expand its function, the functional unit 2140 may serve as an interface controller.

A semiconductor device similar to that described with reference to FIGS. 1 to 42 may be applied to at least one of the microprocessor unit 2120 and the functional unit 2140. For example, the microprocessor unit 2120 or the functional unit 2140 may include the resistance-changeable element 75, the word lines 61 to 64 and the bit pillar 76 and 77. The electronic system 2100 having the resistance-changeable element 75 may exhibit superior electrical characteristics compared to the conventional art.

According to an exemplary embodiment of the inventive concept, a sacrificial plug may be retained in a bit hole during the formation of word lines. The process of forming the word lines may include an etching process for selectively removing sacrificial layers between molding layers. In addition, the process of forming the word lines may be accompanied by a high temperature process. After the high temperature process and the etching process have been completed, the bit hole may be exposed by removing the sacrificial plug. A resistance-changeable element and a bit pillar may be formed in the bit hole. Consequently, the resistance-changeable element can avoid the high temperature process and the etching process. Accordingly, a non-volatile memory device having excellent electrical characteristics can be formed.

The foregoing is illustrative of embodiments of the inventive concept and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A non-volatile memory device, comprising:
a lower molding layer formed on a substrate;
a first horizontal interconnection formed on the lower molding layer;
an upper molding layer formed on the first horizontal interconnection;
a first interlayer insulating layer formed on the upper molding layer;
a second interlayer insulating layer covering sidewalls of the lower molding layer, the upper molding layer and the first horizontal interconnection; and
a pillar connected to the substrate by vertically passing through the upper molding layer, the first horizontal interconnection and the lower molding layer,
wherein the pillar comprises a lower part disposed on the same level as the first horizontal interconnection and having a first width, and an upper part disposed on a higher level than the first horizontal interconnection and having a second width different from the first width.

2. The non-volatile memory device of claim 1, wherein the upper part is formed on the same level as the first interlayer insulating layer.

3. The non-volatile memory device of claim 1, wherein the second interlayer insulating layer extends on the first interlayer insulating layer.

4. The non-volatile memory device of claim 1, wherein the second width is larger than the first width.

5. The non-volatile memory device of claim 1, further comprising a resistance-changeable element formed between the pillar and the first horizontal interconnection.

6. The non-volatile memory device of claim 5, wherein the resistance-changeable element surrounds sidewalk of the upper part and the lower part.

7. The non-volatile memory device of claim 1, further comprising:
a conductive pad formed on the upper part; and
a second horizontal interconnection formed on the conductive pad.

8. A non-volatile memory device, comprising:
a lower molding layer formed on a substrate;
a first horizontal interconnection formed on the lower molding layer;
an upper molding layer formed on the first horizontal interconnection; and
a pillar connected to the substrate by vertically passing through the upper molding layer, the first horizontal interconnection and the lower molding layer,
wherein the pillar comprises a lower part disposed on the same level as the first horizontal interconnection and having a first width, and an upper part disposed on a higher level than the first horizontal interconnection and having a second width different from the first width, and
wherein a central axis of the upper part and a central axis of the lower part are misaligned with each other.

9. A non-volatile memory device, comprising:
a lower molding layer formed on a substrate;
a first horizontal interconnection formed on the lower molding layer;
an upper molding layer formed on the first horizontal interconnection; and
a pillar connected to the substrate by vertically passing through the upper molding layer, the first horizontal interconnection and the lower molding layer,
wherein the pillar comprises a lower part disposed on the same level as the first horizontal interconnection and having a first width, and an upper part disposed on a higher level than the first horizontal interconnection and having a second width different from the first width, and
wherein the pillar comprises an electrode layer, and a reactive metal layer surrounding a sidewall of the electrode layer and in contact with the resistance-changeable element.

10. The non-volatile memory device of claim 9, wherein the pillar further comprises a core surrounded by the electrode layer.

11. A non-volatile memory device, comprising:
a lower molding layer formed on a substrate;
a first horizontal interconnection formed on the lower molding layer;
an upper molding layer formed on the first horizontal interconnection; and
a pillar connected to the substrate by vertically passing through the upper molding layer, the first horizontal interconnection and the lower molding layer,
wherein the pillar comprises a lower part disposed on the same level as the first horizontal interconnection and having a first width, and an upper part disposed on a higher level than the first horizontal interconnection and having a second width different from the first width; and
a diode layer formed between the first horizontal interconnections and the pillar.

12. The non-volatile memory device according to claim 11, wherein the diode layer surrounds sidewalls of the upper part and the lower part.

13. A non-volatile memory device, comprising:
a plurality of molding layers and a plurality of first horizontal interconnections, which are alternately stacked on a substrate;
an interlayer insulating layer formed on the molding layers;
a pillar configured to pass through the interlayer insulating layer, the molding layers and the first horizontal interconnections, and having an upper part and a lower part;
a second horizontal interconnection connected to the upper part; and
a resistance-changeable element formed between the lower part and the first horizontal interconnections,
wherein the upper part and the lower part are asymmetrically aligned, the upper part is in continuity with the lower part, and the upper and lower parts are formed of the same material.

14. A non-volatile memory device, comprising:
a first molding layer and a first horizontal interconnection formed on a substrate;

a second molding layer and a second horizontal interconnection formed on the first horizontal interconnection;

a third molding layer and a third horizontal interconnection formed on the second horizontal interconnection;

a fourth molding layer and a fourth horizontal interconnection formed on the third horizontal interconnection;

an interlayer insulating layer formed on the fourth horizontal interconnection and passing through each of the molding layers and the horizontal interconnections in one or more locations;

a pillar configured to pass through the interlayer insulating layer, the molding layers and the horizontal interconnections, wherein the pillar comprises a lower part disposed on the same level as the first horizontal interconnection and having a first width, and an upper part disposed on a higher level than the first horizontal interconnection and having a second width different from the first width;

a resistance-changeable element formed between the lower part and the first horizontal interconnection.

15. The non-volatile memory device of claim 14, wherein the resistance-changeable element surrounds sidewalk of the upper part and the lower part of the pillar.

16. The non-volatile memory device of claim 14, further comprising a diode layer formed between the first horizontal interconnections and the pillar.

17. The non-volatile memory device of claim 14, wherein the pillar comprises an electrode layer.

18. The non-volatile memory device of claim 17, wherein the pillar comprises a reactive metal layer surrounding a sidewall of the pillar and in contact with the resistance-changeable element.

* * * * *